United States Patent
Kikuchi et al.

(10) Patent No.: US 10,277,271 B2
(45) Date of Patent: Apr. 30, 2019

(54) OPTICAL MODULE

(71) Applicant: NIPPON TELEGRAPH AND TELEPHONE CORPORATION, Tokyo (JP)

(72) Inventors: Kiyofumi Kikuchi, Atsugi (JP); Hiroshi Fukuda, Atsugi (JP); Takashi Saida, Atsugi (JP); Shin Kamei, Atsugi (JP); Ken Tsuzuki, Atsugi (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/744,193

(22) PCT Filed: Jul. 27, 2016

(86) PCT No.: PCT/JP2016/003487
§ 371 (c)(1),
(2) Date: Jan. 12, 2018

(87) PCT Pub. No.: WO2017/017955
PCT Pub. Date: Feb. 2, 2017

(65) Prior Publication Data
US 2018/0198483 A1   Jul. 12, 2018

(30) Foreign Application Priority Data

Jul. 28, 2015  (JP) .................................. 2015-148945

(51) Int. Cl.
*H04B 3/32* (2006.01)
*H01S 5/022* (2006.01)
(Continued)

(52) U.S. Cl.
CPC ............... *H04B 3/32* (2013.01); *H01P 3/081* (2013.01); *H01R 13/6466* (2013.01); *H01S 5/022* (2013.01); *H05K 1/0228* (2013.01)

(58) Field of Classification Search
CPC .... H04B 3/32; H05K 1/0228; H01R 13/6466; H01S 5/022
See application file for complete search history.

(56) References Cited

U.S. PATENT DOCUMENTS 6,677,572 B2 *  1/2004  Ishii ...................... H01L 31/162
                                                          250/214.1
8,313,251 B2 * 11/2012  Maeda ................. G02B 6/4246
                                                          385/89
(Continued)

FOREIGN PATENT DOCUMENTS

JP     H08-08616 A     1/1996
JP     H09-247179     9/1997
(Continued)

OTHER PUBLICATIONS

International Preliminary Report on Patentability dated Feb. 8, 2018, issued in PCT Application No. PCT/JP2016/003487, filed Jul. 27, 2016.
(Continued)

*Primary Examiner* — Daniel Petkovsek
(74) *Attorney, Agent, or Firm* — Workman Nydegger

(57) ABSTRACT

An optical module that suppresses crosstalk between high-frequency transmission lines includes at least one set of: an optical port; an optical processing circuit optically connected to the optical port; an electro-optical transducer optically connected to the optical processing circuit; two or more high-frequency transmission lines connected to the electro-optical transducer; and electrical ports connected to the high-frequency transmission lines, and includes a conductive cover block which is provided above the high-
(Continued)

frequency transmission lines so as to at least partly cover the high-frequency transmission lines and which is grounded.

13 Claims, 37 Drawing Sheets

(51) Int. Cl.
    *H01P 3/08*      (2006.01)
    *H01R 13/6466*   (2011.01)
    *H05K 1/02*      (2006.01)

(56) References Cited

U.S. PATENT DOCUMENTS

| | | | |
|---|---|---|---|
| 8,439,578 B2 * | 5/2013 | Kropp | G02B 6/4279 385/14 |
| 2002/0047088 A1 | 4/2002 | Ishii et al. | |
| 2005/0191057 A1 * | 9/2005 | Nakamoto | G02B 6/4201 398/135 |
| 2005/0248909 A1 * | 11/2005 | Kikuchi | H01C 1/06 361/309 |
| 2010/0098427 A1 | 4/2010 | Ice et al. | |
| 2012/0025366 A1 | 2/2012 | Kanaya et al. | |
| 2014/0241734 A1 | 8/2014 | Sagawa et al. | |

FOREIGN PATENT DOCUMENTS

| | | |
|---|---|---|
| JP | 2001-185741 A | 7/2001 |
| JP | 2002-185408 A | 6/2002 |
| JP | 2006-73935 A | 3/2006 |
| JP | 2009-10149 A | 1/2009 |
| JP | 2009-055212 | 3/2009 |
| JP | 2012-33615 A | 2/2012 |
| JP | 2014-36100 A | 2/2014 |
| JP | 2014-154686 A | 8/2014 |
| JP | 2014-165292 A | 9/2014 |
| JP | 2014-179455 A | 9/2014 |

OTHER PUBLICATIONS

Office Action dated Aug. 7, 2018 in counterpart Japanese Application No. 2017-531019.

* cited by examiner

OPTICAL MODULE

TECHNICAL FIELD

The present invention relates to an optical module for transmitting and signal processing high-frequency electrical signals and optical signals, and more specifically, an optical module in which high-frequency crosstalk is reduced by a three-dimensional ground structure inside the module.

BACKGROUND ART

Against the backdrop of a rapid increase in demand for communications, studies are vigorously conducted for increasing communication network capacity. Amplitude-shift keying (ASK), in which a high-frequency electrical signal of one channel is allocated to light of one channel, was conventionally dominant as an optical modulation format. However, ASK can provide only a one-bit signal to a frequency band. Accordingly, in recent years, research and development of quadrature phase-shift keying (QPSK) and quadrature amplitude modulation (QAM) are actively conducted and these formats go into actual use.

In order to generate a QPSK or QAM signal, an IQ modulator that performs amplitude modulation individually for a real axis and an imaginary axis in a complex representation of light is generally used. The IQ modulator can modulate light of one channel by using high-frequency electrical signals of two channels for the real axis and the imaginary axis. Polarization multiplexing, in which different signals are provided to X polarization component of light and Y polarization component of light and transmitted, is also generally used. In the case of using both of IQ modulation and polarization multiplexing to improve frequency utilization efficiency for increasing communication capacity, light of one channel can be modulated by using high-frequency electrical signals of four channels.

As well as improving frequency utilization efficiency to increase communication capacity, activities are carried out for downsizing a transmission and reception device to increase transmission capacity per unit volume. If a device is downsized without changing transmission capacity per device, the number of devices mounted on a transmission apparatus can be increased, which leads to an increase in the total transmission capacity of the transmission apparatus.

However, if the number of channels for high-frequency electrical signals allocated to light of one channel is increased and an optical transmission and reception module is downsized, there is a problem that distances between high-frequency transmission lines through which electrical signals are transmitted become short and crosstalk between the high-frequency transmission lines becomes large (see, for example, Patent Literature 1).

FIG. 1A and FIG. 1B show the configuration of a conventional optical module 100. FIG. 1A is a top perspective view of the optical module 100 and FIG. 1B is a cross-sectional view along line IB-IB in FIG. 1A. The optical module 100 shown in FIG. 1A and FIG. 1B is disposed at the bottom of a housing 101 and covered with a lid 110. Here, FIG. 1A shows the optical module 100 from which the lid 110 is detached and FIG. 1B shows the optical module 100 to which the lid 110 is attached. The optical module 100 includes an optical processing circuit 103, an electro-optical transducer 104 connected to the optical processing circuit 103, and a lower substrate 109, which are disposed at the bottom of the housing 101. A lower ground 108 is formed on the lower substrate 109 and a high-frequency substrate 107 is formed on the lower ground 108. Four high-frequency transmission lines 105 connected to the electro-optical transducer 104 are formed on the high-frequency substrate 107. The four high-frequency transmission lines 105 constitute microstrip lines. The housing 101 is equipped with an optical port 102 and four electrical ports 106. The optical port 102 is connected to the optical processing circuit 103 and the four electrical ports 106 are connected to the high-frequency transmission lines 105, respectively.

The above configuration is generally applied to an optical module. The optical port 102, the optical processing circuit 103, the electro-optical transducer 104, the high-frequency transmission lines 105, and the electrical ports 106 constitute an optical signal transmission or optical signal reception module. Here, a signal flow is explained using an optical signal transmission module as an example. High-frequency electrical signals are input to the electrical ports 106 of the optical module 100. The high-frequency electrical signals are transmitted through the high-frequency transmission lines 105, converted into optical signals by the electro-optical transducer 104, multiplexed in the optical processing circuit 103, and then output as a wavelength-multiplexed optical signal from the optical port 102.

Since the high-frequency electrical signals are generally transmitted as an electromagnetic field expanded around the high-frequency transmission lines, crosstalk tends to be caused by interference between adjacent channels. Accordingly, as the housing 101 is downsized, the high-frequency transmission lines 105 are provided densely and the intervals become narrow, which results in a problem that crosstalk between the high-frequency transmission lines becomes large and affects the characteristics of transmitted signals.

The present invention has been accomplished in consideration of the conventional technique described above. The present invention aims to provide an optical module that suppresses crosstalk between high-frequency transmission lines.

CITATION LIST

Patent Literature

Patent Literature 1: Japanese Patent Application Laid-open No. 2014-154686

SUMMARY OF INVENTION

In order to solve the above problem, in one aspect of the present invention, an optical module comprises at least one set of: an optical port; an optical processing circuit optically connected to the optical port; an electro-optical transducer optically connected to the optical processing circuit; two or more high-frequency transmission lines connected to the electro-optical transducer; and electrical ports connected to the high-frequency transmission lines, and the optical module comprises a conductive cover block which is provided above the high-frequency transmission lines so as to at least partly cover the high-frequency transmission lines and which is grounded.

The present invention produces an advantageous result of reducing crosstalk between transmission lines of high-frequency transmission lines provided densely in an optical module.

DESCRIPTION OF EMBODIMENTS

Embodiments of the present invention will be described below with reference to the drawings.

First Embodiment

Figure 1A:
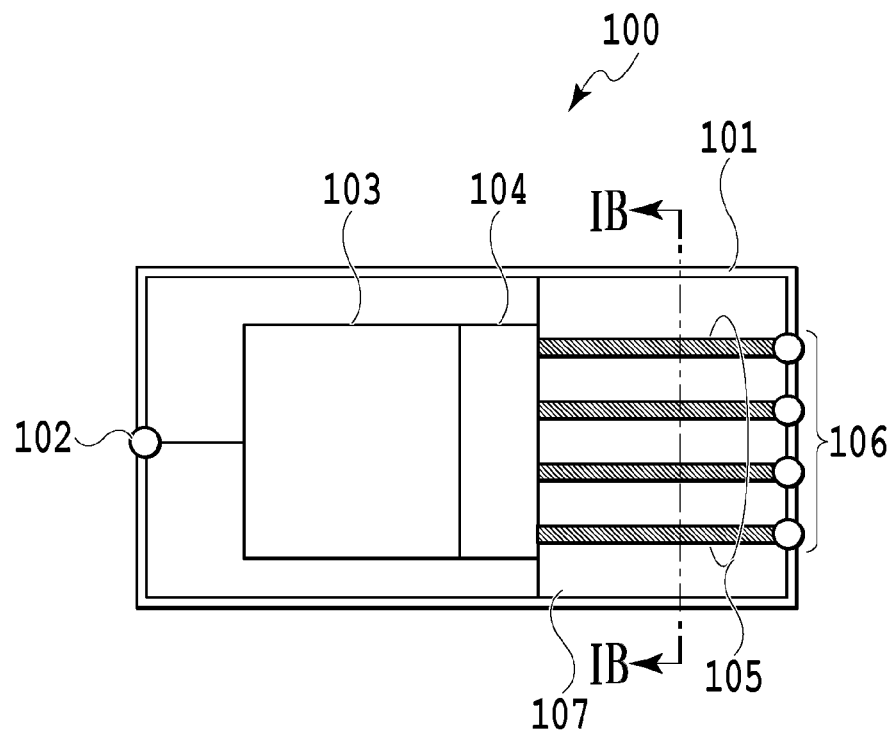
FIG. 1A is a top perspective view showing a conventional optical module.
Figure 1B:
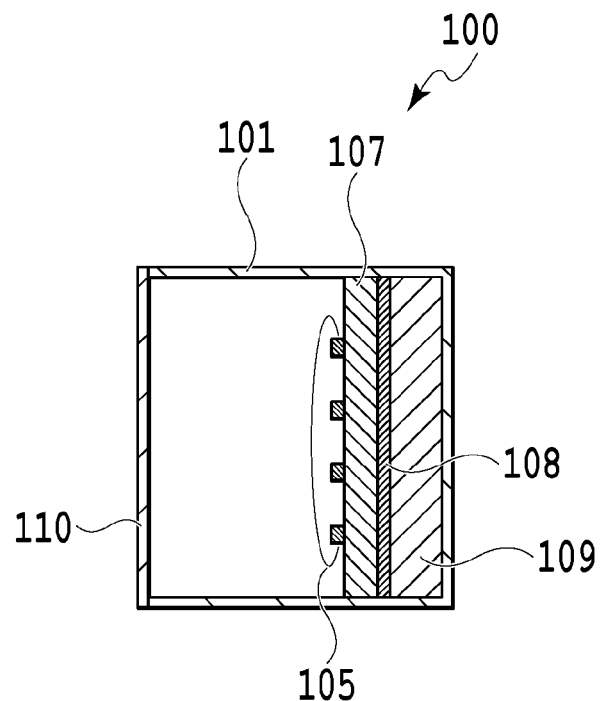
FIG. 1B is a cross-sectional view along line IB-IB in FIG. 1A.
Figure 2A:
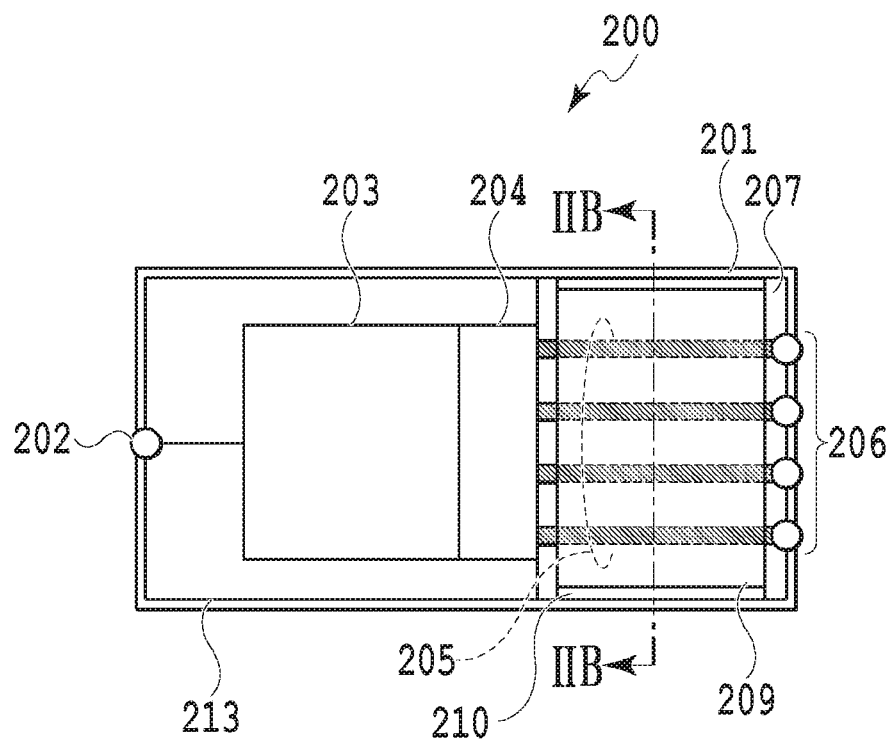
FIG. 2A is a top perspective view showing an optical module according to a first embodiment of the present invention.
Figure 2B:
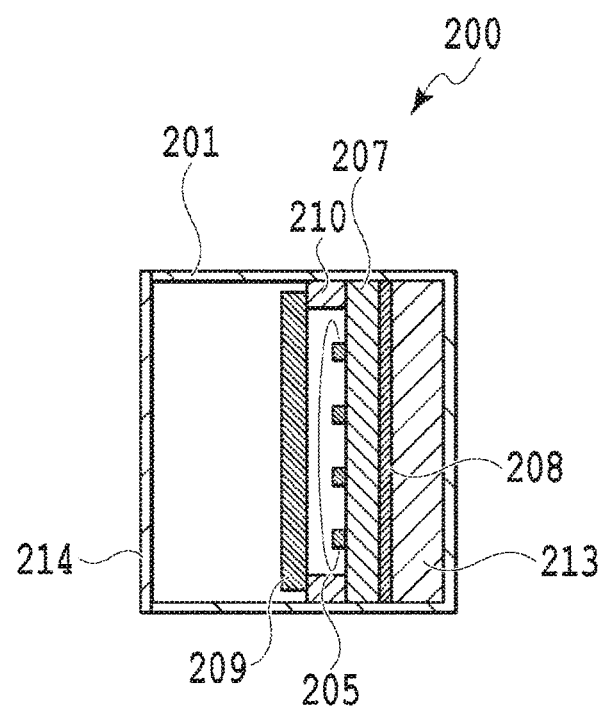
FIG. 2B is a cross-sectional view along line IIB-IIB in FIG. 2A.

FIG. 2A and FIG. 2B show the configuration of an optical module 200 according to a first embodiment of the present invention. FIG. 2A is a top perspective view of the optical module 200 and FIG. 2B is a cross-sectional view along line IIB-IIB in FIG. 2A. The optical module 200 shown in FIG. 2A and FIG. 2B is disposed at the bottom of a housing 201 and covered with a lid 214. Here, FIG. 2A shows the optical module 200 from which the lid 214 is detached and FIG. 2B shows the optical module 200 to which the lid 214 is attached. The optical module 200 includes an optical processing circuit 203, an electro-optical transducer 204 connected to the optical processing circuit 203, and a lower substrate 213, which are disposed at the bottom of the housing 201. A lower ground 208 is formed on the lower substrate 213 and a high-frequency substrate 207 is formed on the lower ground 208. Four high-frequency transmission lines 205 connected to the electro-optical transducer 204 are formed on the high-frequency substrate 207. The four high-frequency transmission lines 205 constitute microstrip lines. The housing 201 is equipped with an optical port 202 and four electrical ports 206. The optical port 202 is connected to the optical processing circuit 203 and the four electrical ports 206 are connected to the high-frequency transmission lines 205, respectively.

The optical module 200 is further equipped with a conductive cover block 209 so as to cover the high-frequency transmission lines 205. The cover block 209 is fixed to the high-frequency substrate 207 via spacers 210. The spacers 210 keep a given space between the cover block 209 and the high-frequency substrate 207 and the high-frequency transmission lines 205 on the high-frequency substrate 207. In the present embodiment, the material for the cover block 209 is copper and the material for the housing 201 is copper-tungsten. However, the materials for the optical module 200 of the present invention are not limited to those and may be, for example, general metals.

Here, the cover block 209 is grounded. The connection to the ground is made by forming the spacers 210 and the housing 201 as conductive components and electrically connecting the cover block 209 to the lower ground 208. Further, the housing 201 may be connected to the ground of the electro-optical transducer 204 or the ground of the electrical ports 206 (e.g., the ground of GPPO connectors).

The above configuration is generally applied to an optical module. The optical port 202, the optical processing circuit 203, the electro-optical transducer 204, the high-frequency transmission lines 205, and the electrical ports 206 constitute an optical signal transmission or optical signal reception module. If the optical module 200 functions as an optical signal transmission module, the optical processing circuit 203 multiplexes input optical signals to convert them into a wavelength-multiplexed optical signal. On the other hand, if the optical module 200 functions as an optical signal reception module, the optical processing circuit 203 converts an input wavelength-multiplexed optical signal into a plurality of optical signals.

As a signal flow in the optical signal transmission module, high-frequency electrical signals are input to the electrical ports 206 of the optical module 200. The high-frequency electrical signals are transmitted through the high-frequency transmission lines 205, converted into optical signals by the electro-optical transducer 204, multiplexed in the optical processing circuit 203, and then output as a wavelength-multiplexed optical signal from the optical port 202. On the other hand, as the optical signal reception module, a wavelength-multiplexed optical signal is input to the optical port 202 of the optical module 200. The wavelength-multiplexed optical signal is divided into signals of different frequencies in the optical processing circuit 203, converted into high-frequency electrical signals by the electro-optical transducer 204, transmitted through the high-frequency transmission lines 205, and output as the high-frequency electrical signals from the electrical ports 206.

The high-frequency electrical signals transmitted through the high-frequency transmission lines 205 generally propagate in a mode of spreading around the periphery of the lines. In other words, it can be said that electric lines of force emanating from the high-frequency transmission lines 205 face directions of spreading around the periphery. High-frequency crosstalk is caused by an electric line of force emanating from a high-frequency transmission line and terminated at an adjacent high-frequency transmission line. Accordingly, if the cover block 209, which is a grounded conductor, is provided above the high-frequency transmission lines 205, an electric line of force emanating from a high-frequency transmission line is attracted to the cover block 209 and is less prone to be directed to an adjacent high-frequency transmission line. Consequently, crosstalk between transmission lines of the high-frequency transmission lines 205 can be reduced by providing the cover block 209.

In the present embodiment, high-frequency crosstalk between the high-frequency transmission lines 205, which constitute microstrip lines, is reduced. However, crosstalk between transmission lines can be reduced also in a case where a cover block is provided above a coplanar line.

Second Embodiment

Figure 3A:
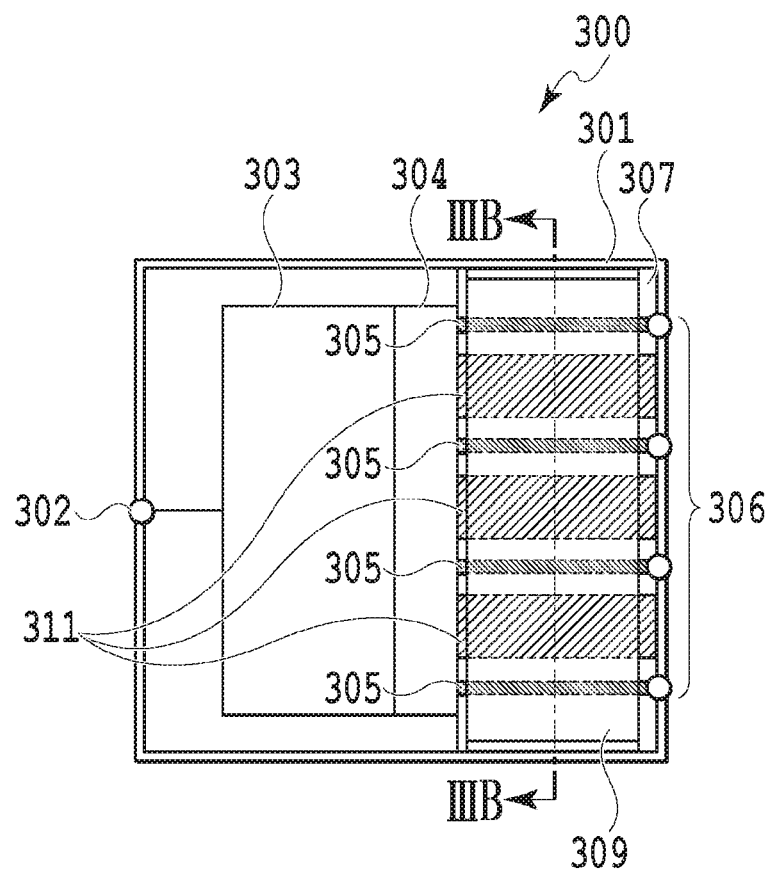
FIG. 3A is a top perspective view showing an optical module according to a second embodiment of the present invention.
Figure 3B:
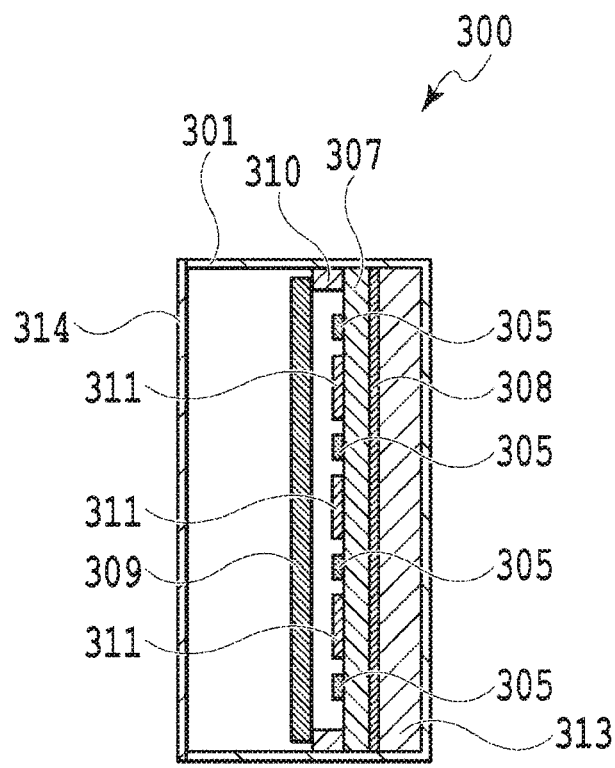
FIG. 3B is a cross-sectional view along line IIIB-IIIB in FIG. 3A.

FIG. 3A and FIG. 3B show the configuration of an optical module 300 according to a second embodiment of the present invention. FIG. 3A is a top perspective view of the optical module 300 and FIG. 3B is a cross-sectional view along line IIIB-IIIB in FIG. 3A. The optical module 300 shown in FIG. 3A and FIG. 3B is disposed at the bottom of a housing 301 and covered with a lid 314. Here, FIG. 3A shows the optical module 300 from which the lid 314 is detached and FIG. 3B shows the optical module 300 to which the lid 314 is attached. The optical module 300 includes an optical processing circuit 303, an electro-optical transducer 304 connected to the optical processing circuit 303, and a lower substrate 313, which are disposed at the bottom of the housing 301. A lower ground 308 is formed on the lower substrate 313 and a high-frequency substrate 307 is formed on the lower ground 308. Four high-frequency transmission lines 305 connected to the electro-optical transducer 304 are formed on the high-frequency substrate 307. The four high-frequency transmission lines 305 constitute microstrip lines. The housing 301 is equipped with an optical port 302 and four electrical ports 306. The optical port 302 is connected to the optical processing circuit 303 and the four electrical ports 306 are connected to the high-frequency transmission lines 305, respectively.

The optical module 300 is further equipped with a conductive cover block 309 so as to cover the high-frequency transmission lines 305. The cover block 309 is fixed to the high-frequency substrate 307 via spacers 310. The spacers 310 keep a given space between the cover block 309 and the high-frequency substrate 307 and the high-frequency transmission lines 305 on the high-frequency substrate 307. In the present embodiment, the material for the cover block 309 is copper. The material for the housing 301 is copper-tungsten, but may be a general metal.

In the optical module 300, a ground electrode 311 is further formed in a longitudinal direction of the housing between each two adjacent high-frequency transmission lines of the four high-frequency transmission lines 305 formed on the high-frequency substrate 307.

Here, the cover block 309 and the ground electrodes 311 are grounded. The connection of the cover block 309 to the ground is made by forming the spacers 310 and the housing 301 as conductive components and electrically connecting the cover block 309 to the ground of the lower ground 308. The connection of the ground electrodes 311 to the ground is made by electrically connecting the ground electrodes 311 to the lower ground 308 via metal vias provided in the high-frequency substrate 307. Further, the housing 301 may be connected to the ground of the electro-optical transducer 304 or the ground of the electrical ports 306.

High-frequency electrical signals transmitted through the high-frequency transmission lines 305 generally propagate in a mode of spreading around the periphery of the lines. In other words, it can be said that electric lines of force emanating from the high-frequency transmission lines 305 face directions of spreading around the periphery. High-frequency crosstalk is caused by an electric line of force emanating from a high-frequency transmission line and terminated at an adjacent high-frequency transmission line. Accordingly, if the cover block 309 and the ground electrodes 311, which are grounded conductors, are provided, an electric line of force emanating from a high-frequency transmission line is attracted to the cover block 309 and the ground electrodes 311 and is less prone to be directed to an adjacent high-frequency transmission line. Consequently, crosstalk between the high-frequency transmission lines 305 can be reduced by providing the cover block 309 and the ground electrodes 311. In the present embodiment, the material for the cover block 309 and the ground electrodes 311 is copper.

Third Embodiment

Figure 4A:
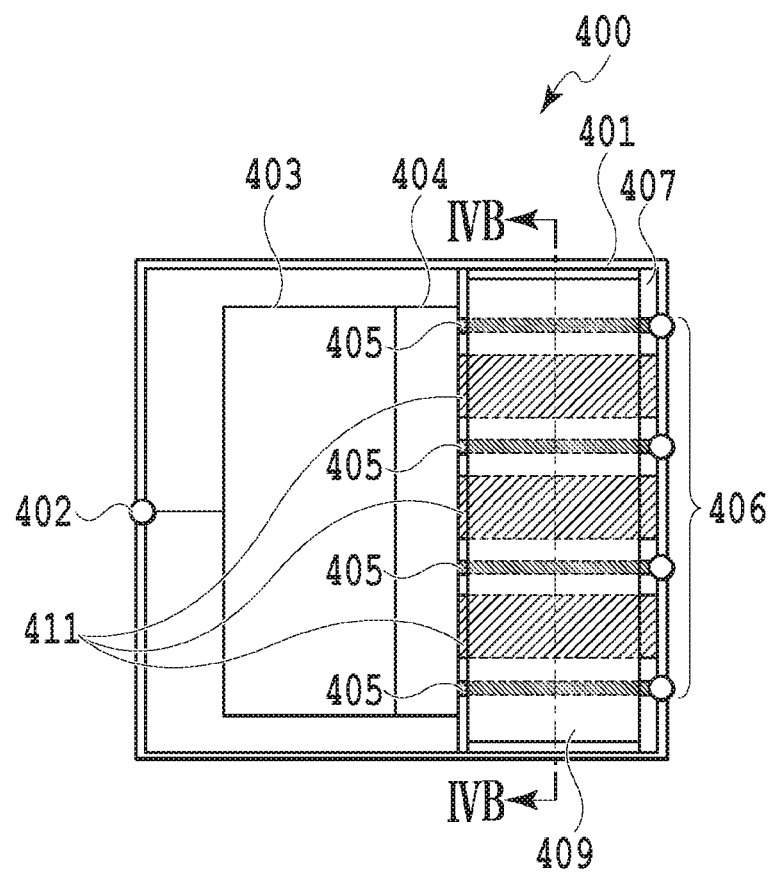
FIG. 4A is a top perspective view showing an optical module according to a third embodiment of the present invention.
Figure 4B:
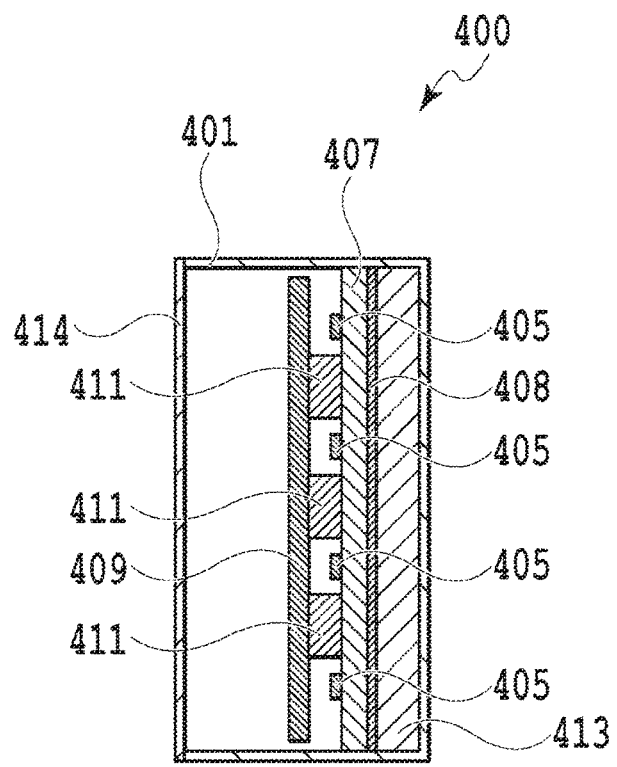
FIG. 4B is a cross-sectional view along line IVB-IVB in FIG. 4A.

FIG. 4A and FIG. 4B show the configuration of an optical module 400 according to a third embodiment of the present invention. FIG. 4A is a top perspective view of the optical module 400 and FIG. 4B is a cross-sectional view along line IVB-IVB in FIG. 4A. The optical module 400 shown in FIG. 4A and FIG. 4B is disposed at the bottom of a housing 401 and covered with a lid 414. Here, FIG. 4A shows the optical module 400 from which the lid 414 is detached and FIG. 4B shows the optical module 400 to which the lid 414 is attached. The optical module 400 includes an optical processing circuit 403, an electro-optical transducer 404 connected to the optical processing circuit 403, and a lower substrate 413, which are disposed at the bottom of the housing 401. A lower ground 408 is formed on the lower substrate 413 and a high-frequency substrate 407 is formed on the lower ground 408. Four high-frequency transmission lines 405 connected to the electro-optical transducer 404 are formed on the high-frequency substrate 407. The four high-frequency transmission lines 405 constitute microstrip lines. The housing 401 is equipped with an optical port 402 and four electrical ports 406. The optical port 402 is connected to the optical processing circuit 403 and the four electrical ports 406 are connected to the high-frequency transmission lines 405, respectively.

The optical module 400 is further equipped with a conductive cover block 409 so as to cover the high-frequency transmission lines 405. A ground electrode 411 is formed in each of gaps between the four high-frequency transmission lines 405 formed on the high-frequency substrate 407. The cover block 409 is fixed to the high-frequency substrate 407 via the ground electrodes 411. The ground electrodes 411 keep a given space between the cover block 409 and the high-frequency substrate 407 and the high-frequency transmission lines 405 on the high-frequency substrate 407. In the present embodiment, the material for the cover block 409 is copper. The material for the housing 401 is copper-tungsten, but may be a general metal.

Here, the cover block 409 and the ground electrodes 411 are grounded. The connection to the ground is made by providing metal vias in the high-frequency substrate 407 and electrically connecting the ground electrodes 411 to the lower ground 408. Further, the housing 401 may be connected to the ground of the electro-optical transducer 404 or the ground of the electrical ports 406.

Fourth Embodiment

Figure 5A:
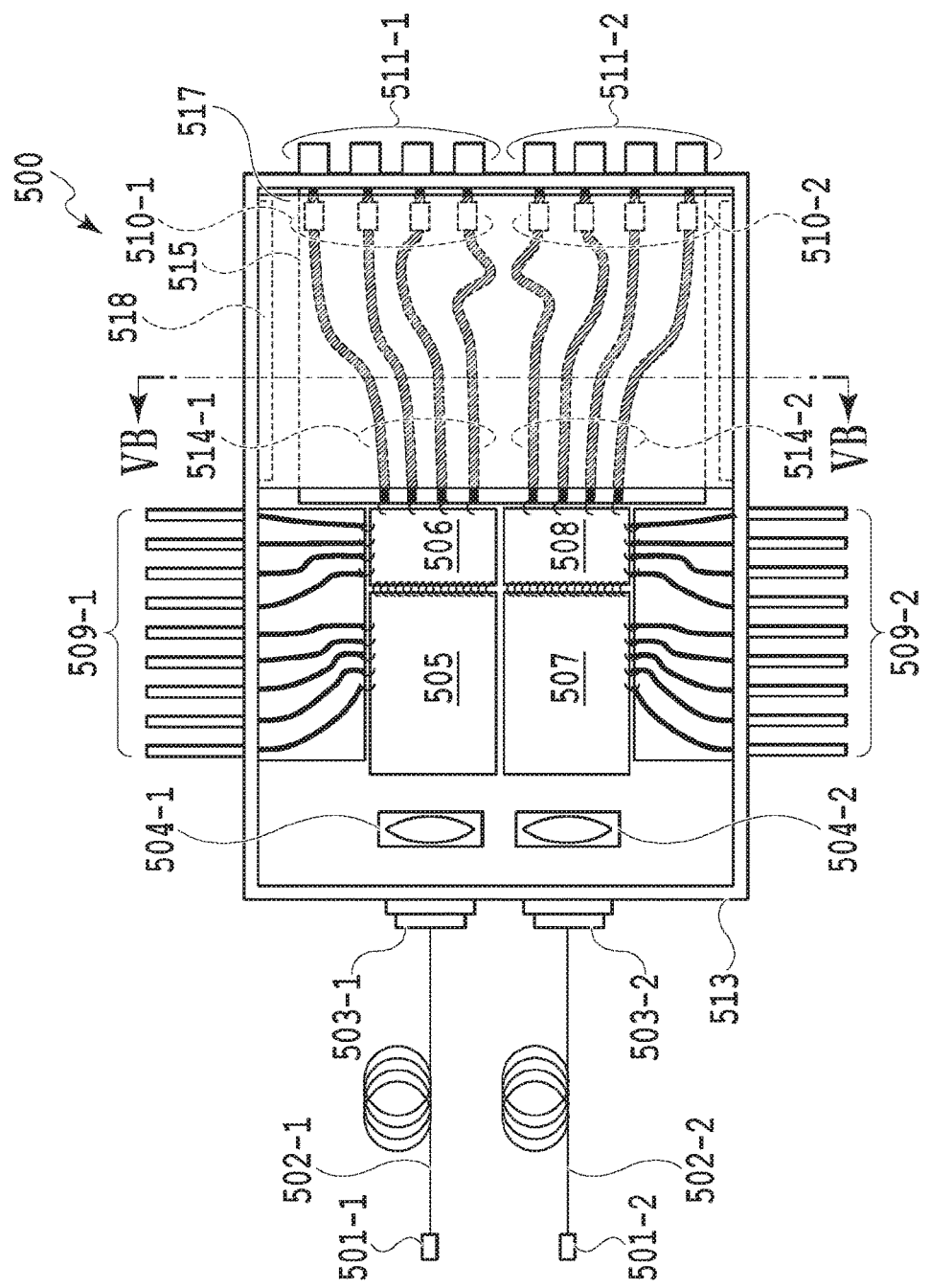
FIG. 5A is a top perspective view showing an optical module according to a fourth embodiment of the present invention.
Figure 5B:
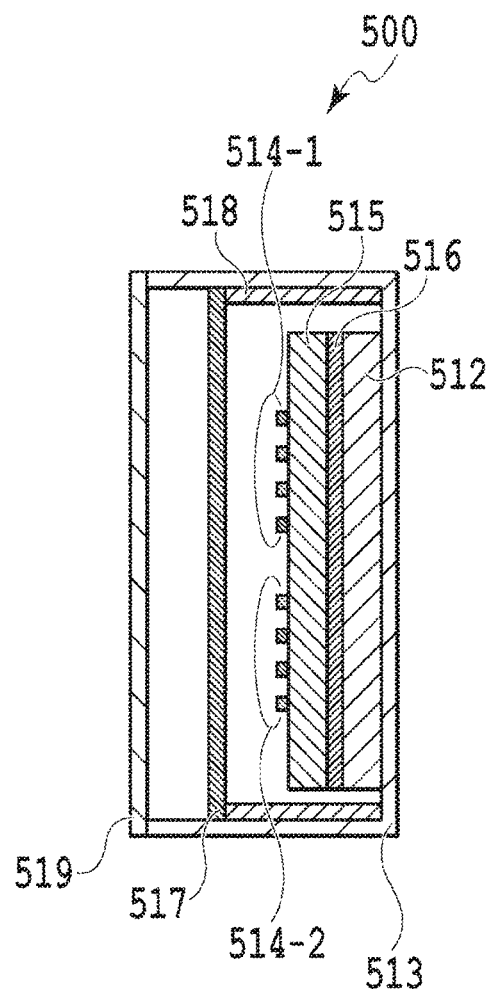
FIG. 5B is a cross-sectional view along line VB-VB in FIG. 5A.

FIG. 5A and FIG. 5B show the configuration of an optical module 500 according to a fourth embodiment of the present invention. FIG. 5A is a top perspective view of the optical module 500 and FIG. 5B is a cross-sectional view along line VB-VB in FIG. 5A. The optical module 500 shown in FIG. 5A and FIG. 5B is disposed at the bottom of a housing 513 and covered with a lid 519. Here, FIG. 5A shows the optical module 500 from which the lid 519 is detached and FIG. 5B shows the optical module 500 to which the lid 519 is attached. The optical module 500 includes an optical modulator 505, a driver IC 506 connected to the optical modulator 505, an optical receiver 507, and a transimpedance amplifier (TIA) IC 508 connected to the optical receiver 507, which are disposed at the bottom of the housing 513. The optical modulator 505 and the optical receiver 507 have the functions of an optical processing circuit and an electro-optical signal transducer. The optical modulator 505 and the driver IC 506 are connected to each other by wire bonding. The optical receiver 507 and the TIA IC 508 are also connected to each other by wire bonding.

The optical module 500 also includes a lower substrate 512 disposed at the bottom of the housing 513. A lower ground 516 is formed on the lower substrate 512 and a high-frequency substrate 515 is formed on the lower ground 516. Four high-frequency transmission lines 514-1 connected to the driver IC 506 and four high-frequency transmission lines 514-2 connected to the TIA IC 508 are formed on the high-frequency substrate 515. The four high-frequency transmission lines 514-1 and the four high-frequency transmission lines 514-2 constitute microstrip lines.

Further, the housing 513 is equipped with a sapphire window 503-1 for outputting light, a sapphire window 503-2 for inputting light, and eight GPPO connectors 511-1 and 511-2. An output optical fiber 502-1 is connected to the sapphire window 503-1 for outputting light and an output optical connector 501-1 is connected to the output optical fiber 502-1. An input optical fiber 502-2 is connected to the sapphire window 503-2 for inputting light and an input optical connector 501-2 is connected to the input optical fiber 502-2. A lens 504-1 is disposed between the sapphire window 503-1 for outputting light and the optical modulator 505. A lens 504-2 is disposed between the sapphire window 503-2 for inputting light and the optical receiver 507. The GPPO connectors 511-1 are connected to the respective high-frequency transmission lines 514-1 and the GPPO connectors 511-2 are connected to the respective high-frequency transmission lines 514-2.

The optical module 500 also comprises DC pins 509-1 connected to the optical receiver 507 and DC pins 509-2 electrically connected to the TIA IC 508. The optical module 500 further comprises DC blocking capacitors 510-1 provided in the high-frequency transmission lines 514-1 and DC blocking capacitors 510-2 provided in the high-frequency transmission lines 514-2.

The optical module 500 is further equipped with a cover block 517 so as to cover the high-frequency transmission lines 514-1 and 514-2. The cover block 517 is fixed to the high-frequency substrate 515 via spacers 518. The spacers 518 keep a given space between the cover block 517 and the high-frequency substrate 515 and the high-frequency transmission lines 514-1 and 514-2 on the high-frequency substrate 515. In the present embodiment, the material for the cover block 517 is copper and the material for the housing 513 is copper-tungsten.

The cover block 517 is grounded. The connection to the ground is made by forming the spacers 518 and the housing 513 as conductive components, providing metal vias in the lower substrate 512, and electrically connecting the cover block 517 to the lower ground 516.

The optical module 500 has a parallel configuration of the optical signal transmission module and the optical signal reception module. That is, the optical connector 501-1, the optical fiber 502-1, the sapphire window 503-1, the lens 504-1, the optical modulator 505, the driver IC 506, the high-frequency transmission lines 514-1, the DC blocking capacitors 510-1, and the GPPO connectors 511-1 constitute the optical signal transmission module. Further, the optical connector 501-2, the optical fiber 502-2, the sapphire window 503-2, the lens 504-2, the optical receiver 507, the TIA IC 508, the high-frequency transmission lines 514-2, the DC blocking capacitors 510-2, and the GPPO connectors 511-2 constitute the optical signal reception module.

As a signal flow in the optical signal transmission module, a high-frequency voltage signal is input to each of the GPPO connectors 511-1 of the optical module 500. The high-frequency voltage signals are transmitted through the respective DC blocking capacitors 510 and the respective high-frequency transmission lines 514-1 and input to the driver IC 506. The high-frequency voltage signals are converted into high-frequency current signals by the driver IC 506, and converted into optical signals and multiplexed into a wavelength-multiplexed optical signal by the optical modulator 505. The wavelength-multiplexed optical signal from the optical modulator 505 is condensed into the sapphire window 503-1 by the lens 504-1, passes through the sapphire window 503-1 and propagates to the optical connector 501-1 through the optical fiber 502-1.

On the other hand, as a signal flow in the optical signal reception module, a wavelength-multiplexed optical signal input to the optical connector 501-2 propagates to the sapphire window 503-2 through the optical fiber 502-2. After passing through the sapphire window 503-2, the wavelength-multiplexed optical signal is collimated by the lens 504-2 and input to the optical receiver 507. The wavelength-multiplexed optical signal is demultiplexed and converted into high-frequency current signals by the optical receiver 507, and then converted into high-frequency voltage signals by the TIA IC 508. The high-frequency voltage signals are transmitted from the TIA IC 508 to the respective high-frequency transmission lines 514 and the respective DC blocking capacitors 510 and output from the GPPO connectors 511-2.

The optical module 500 of the present embodiment has a parallel configuration of the optical signal transmission module and the optical signal reception module. Even in an optical module having a parallel configuration like the present embodiment, crosstalk from a transmitting end (514-1) to a receiving end (514-2) and from the receiving end (514-2) to the transmitting end (514-1) in the high-frequency transmission lines can be reduced by providing the cover block 517.

Figure 6:
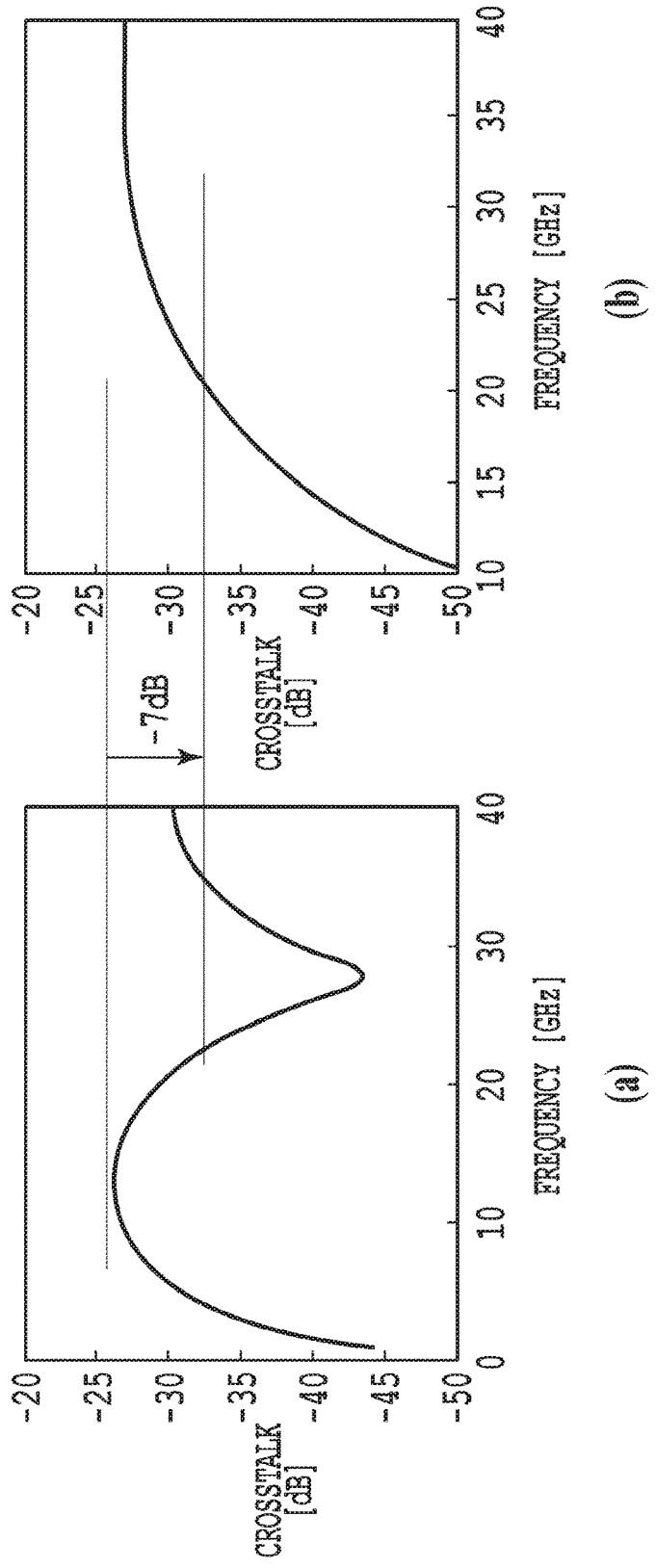
FIG. 6 is a graph showing the crosstalk suppression effect of the fourth embodiment of the present invention, FIG. 6 (a) shows crosstalk characteristics in a conventional optical module and FIG. 6 (b) shows those in the present invention.

In the present embodiment, gold high-frequency transmission lines 514-1 and 514-2 are formed on a ceramic high-frequency substrate 515 having a thickness of 150 μm, and a copper cover block 517 is provided above the high-frequency transmission lines 514-1 and 514-2. The high-frequency transmission lines 514-1 and 514-2 are formed such that a pattern thickness is 2 μm, a width is 100 μm, a gap between lines is 400 μm, and a distance between the cover block 517 and the high-frequency substrate 515 is 200 μm. FIG. 6 is a graph showing the crosstalk suppression effect of the present embodiment. FIG. 6 (*a*) shows crosstalk characteristics in a conventional optical module and FIG. 6 (*b*) shows those in the optical module 500. FIGS. 6 (*a*) and (*b*) show that the optical module 500 of the present embodiment produces a crosstalk suppression effect of 7 dB at the maximum as compared with the conventional one at generally used signal frequencies from 0 to 20 GHz.

In the optical module 500 of the present embodiment, the material for the housing 513 is copper-tungsten because it has high thermal conductivity and is effective in dissipating heat. However, the material for the optical module 500 of the present invention is not limited to this and may be, for example, a general metal.

Further, the material for the cover block 517 is copper in the above description, but the optical module 500 of the present invention is not limited to this example. For instance, the cover block 517 may be formed using a conductive material other than copper or may be a block obtained by providing a surface of an insulating material such as ceramic with a conductive film as a matter of course.

Further, in the above description, the lower ground 516 is provided below the high-frequency substrate 515 and the high-frequency transmission lines 514-1 and 514-2, and the cover block 517 is provided above them. However, the optical module 500 of the present invention is not limited to this example. The position relationship between the ground and cover block may be turned upside down or the ground and the cover block may be located from side to side.

Fifth Embodiment

Figure 7A:
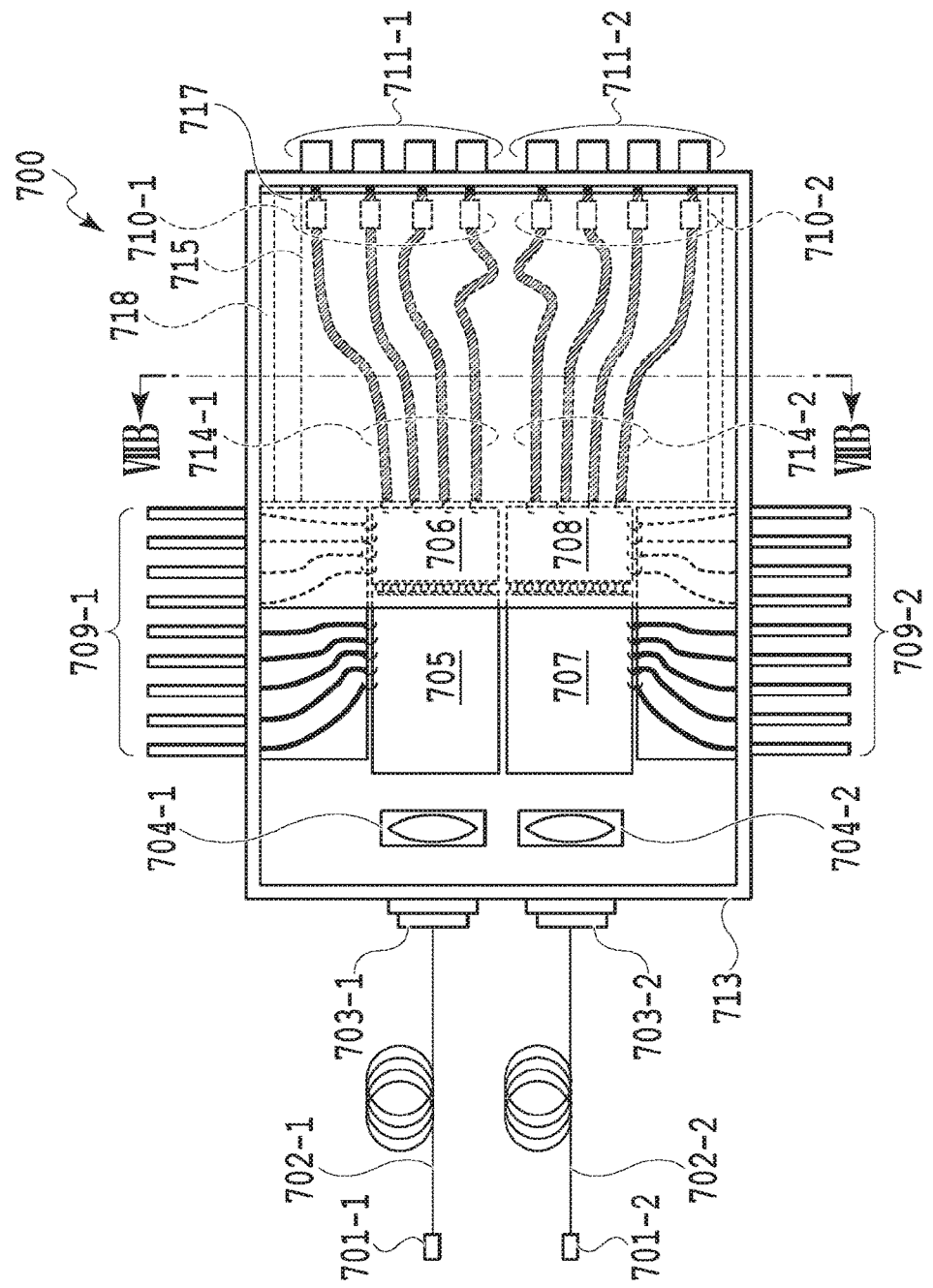
FIG. 7A is a top perspective view showing an optical module according to a fifth embodiment of the present invention.
Figure 7B:
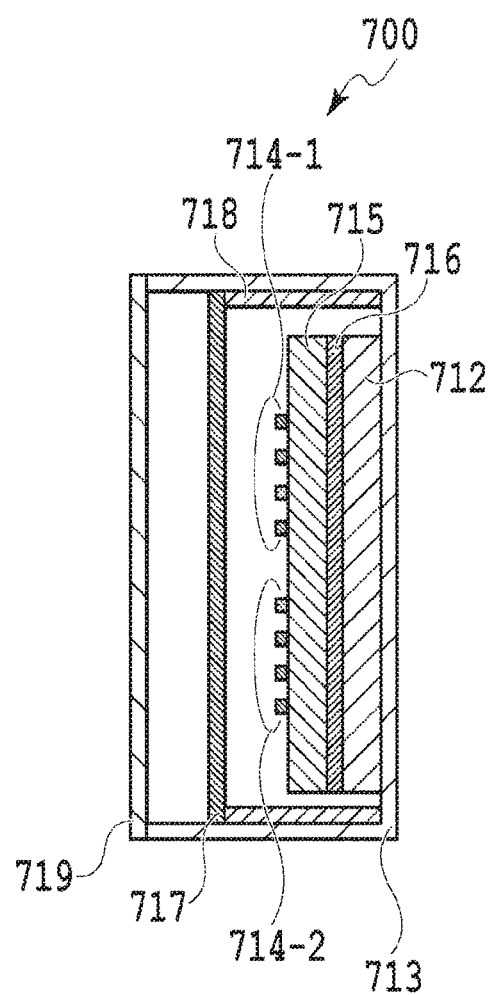
FIG. 7B is a cross-sectional view along line VIIB-VIIB in FIG. 7A.

FIG. 7A and FIG. 7B show the configuration of an optical module 700 according to a fifth embodiment of the present invention. FIG. 7A is a top perspective view of the optical module 700 and FIG. 7B is a cross-sectional view along line VIIB-VIIB in FIG. 7A. The optical module 700 shown in FIG. 7A and FIG. 7B is disposed at the bottom of a housing 713 and covered with a lid 719. Here, FIG. 7A shows the optical module 700 from which the lid 719 is detached and FIG. 7B shows the optical module 700 to which the lid 719 is attached. The optical module 700 includes an optical modulator 705, a driver IC 706 connected to the optical modulator 705, an optical receiver 707, and a transimpedance amplifier (TIA) IC 708 connected to the optical receiver 707, which are disposed at the bottom of the housing 713. The optical modulator 705 and the optical receiver 707 have the functions of an optical processing circuit and an electro-optical signal transducer. The optical modulator 705 and the driver IC 706 are connected to each other by wire bonding. The optical receiver 707 and the TIA IC 708 are also connected to each other by wire bonding.

The optical module 700 also includes a lower substrate 712 disposed at the bottom of the housing 713. A lower ground 716 is formed on the lower substrate 712 and a high-frequency substrate 715 is formed on the lower ground 716. Four high-frequency transmission lines 714-1 connected to the driver IC 706 and four high-frequency transmission lines 714-2 connected to the TIA IC 708 are formed on the high-frequency substrate 715 to constitute microstrip lines.

Further, the housing 713 is equipped with a sapphire window 703-1 for outputting light, a sapphire window 703-2 for inputting light, and eight GPPO connectors 711-1 and 711-2. An output optical fiber 702-1 is connected to the sapphire window 703-1 for outputting light and an output optical connector 701-1 is connected to the output optical fiber 702-1. An input optical fiber 702-2 is connected to the sapphire window 703-2 for inputting light and an input optical connector 701-2 is connected to the input optical fiber 702-2. A lens 704-1 is disposed between the sapphire window 703-1 for outputting light and the optical modulator 705. A lens 704-2 is disposed between the sapphire window 703-2 for inputting light and the optical receiver 707. The GPPO connectors 711-1 are connected to the respective high-frequency transmission lines 714-1 and the GPPO connectors 711-2 are connected to the respective high-frequency transmission lines 714-2.

The optical module 700 also comprises DC pins 709-1 connected to the optical receiver 707 and DC pins 709-2 electrically connected to the TIA IC 708. The optical module 700 further comprises DC blocking capacitors 710-1 provided in the high-frequency transmission lines 714-1 and DC blocking capacitors 710-2 provided in the high-frequency transmission lines 714-2.

The optical module 700 is further equipped with a cover block 717 so as to cover the high-frequency transmission lines 714-1 and 714-2, the driver IC 706, the TIA IC 708, connection wires between the driver IC 706 and the optical modulator 705, and connection wires between the TIA IC 708 and the optical receiver 707. The cover block 717 is fixed to the high-frequency substrate 715 via spacers 718. The spacers 718 keep a given space between the cover block 717 and the high-frequency substrate 715 and the high-frequency transmission lines 714-1 and 714-2 on the high-frequency substrate 715. In the present embodiment, the material for the cover block 717 is copper. The material for the housing 713 is copper-tungsten, but may be a general metal.

The cover block 717 is grounded. The connection to the ground is made by forming the spacers 718 and the housing 713 as conductive components, providing metal vias in the lower substrate 712, and electrically connecting the cover block 717 to the lower ground 716.

The optical module 700 has a parallel configuration of the optical signal transmission module and the optical signal reception module. That is, the optical connector 701-1, the optical fiber 702-1, the sapphire window 703-1, the lens 704-1, the optical modulator 705, the driver IC 706 the high-frequency transmission lines 714-1, the DC blocking capacitors 710-1, and the GPPO connectors 711-1 constitute the optical signal transmission module. Further, the optical connector 701-2, the optical fiber 702-2, the sapphire window 703-2, the lens 704-2, the optical receiver 707, the TIA IC 708, the high-frequency transmission lines 714-2, the DC blocking capacitors 710-2, and the GPPO connectors 711-2 constitute the optical signal reception module.

In an optical module having a parallel configuration like the present embodiment, crosstalk from a transmitting end (714-1) to a receiving end (714-2) and from the receiving end (714-2) to the transmitting end (714-1) in the high-frequency transmission lines can be reduced by providing the cover block 717. At the same time, it is also possible to suppress crosstalk that occurs between wires in the connection wires between the driver IC 706 and the optical modulator 705 and the connection wires between the TIA IC 708 and the optical receiver 707.

Sixth Embodiment

Figure 8A:
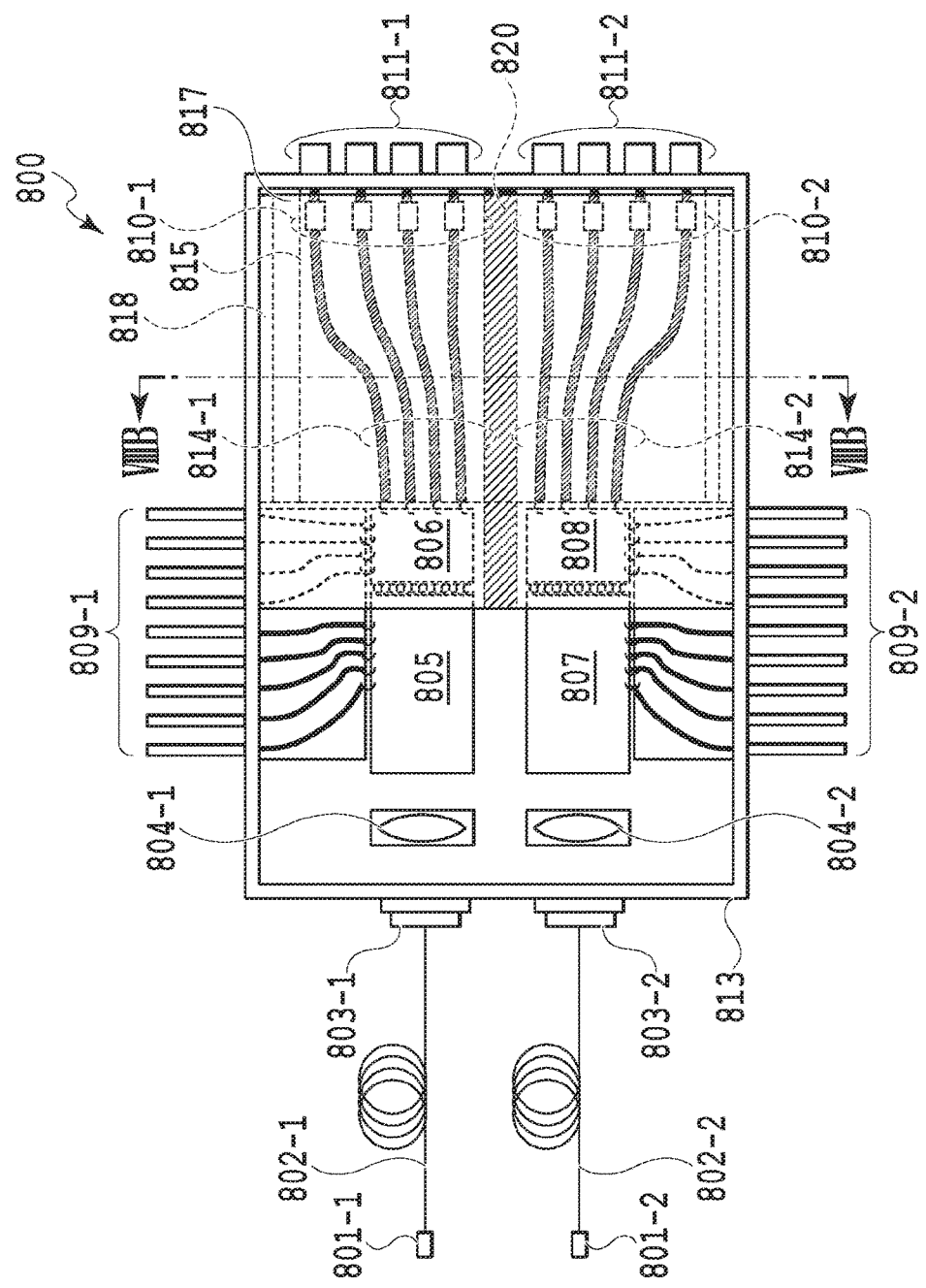
FIG. 8A is a top perspective view showing an optical module according to a sixth embodiment of the present invention.
Figure 8B:
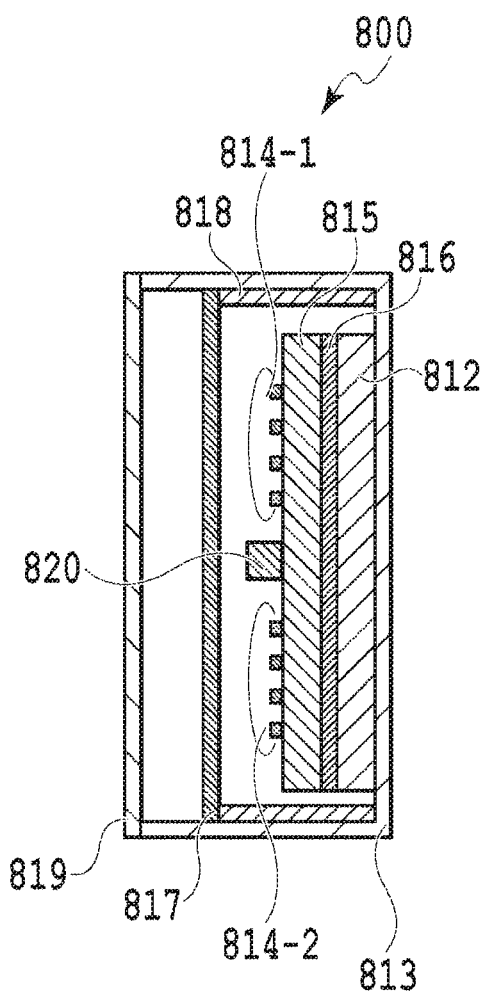
FIG. 8B is a cross-sectional view along line VIIIB-VIIIB in FIG. 8A.
Figure 8C:
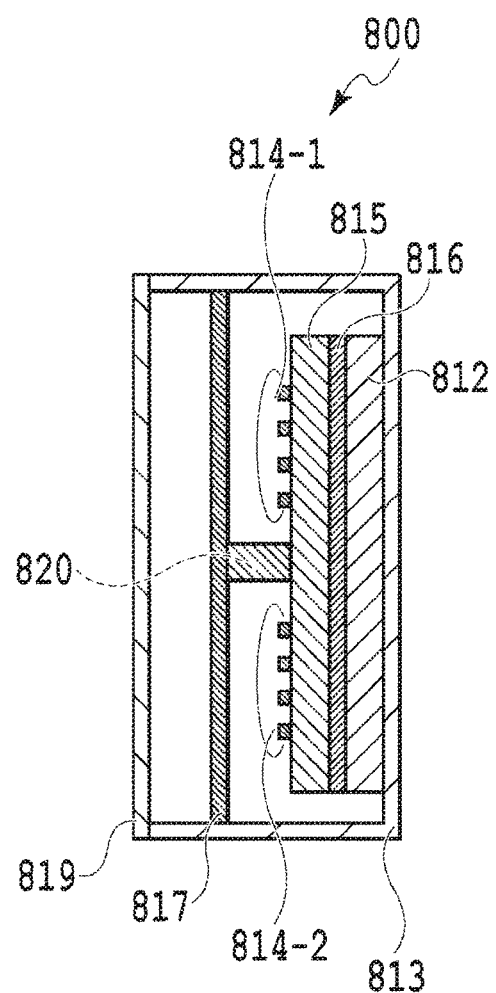
FIG. 8C is a cross-sectional view along line VIIIB-VIIIB in FIG. 8A.

FIG. 8A and FIG. 8B show the configuration of an optical module 800 according to a sixth embodiment of the present invention. Further, FIG. 8C shows the configuration of the optical module 800 according to a modified example of the sixth embodiment of the present invention. FIG. 8A is a top perspective view of the optical module 800 and FIG. 8B and FIG. 8C are cross-sectional views seen along line VIIIB-VIIIB in FIG. 8A. The optical module 800 shown in FIG. 8A, FIG. 8B, and FIG. 8C is disposed at the bottom of a housing 813 and covered with a lid 819. Here, FIG. 8A shows the optical module 800 from which the lid 819 is detached and FIG. 8B and FIG. 8C show the optical module 800 to which the lid 819 is attached. The optical module 800 includes an optical modulator 805, a driver IC 806 connected to the optical modulator 805, an optical receiver 807, and a transimpedance amplifier (TIA) IC 808 connected to the optical receiver 807, which are disposed at the bottom of the housing 813. The optical modulator 805 and the optical receiver 807 have the functions of an optical processing circuit and an electro-optical signal transducer. The optical modulator 805 and the driver IC 806 are connected to each other by wire bonding. The optical receiver 807 and the TIA IC 808 are also connected to each other by wire bonding.

Further, in the optical module 800, a lower substrate 812 is disposed at the bottom of the housing 813. A lower ground 816 is formed on the lower substrate 812 and a high-frequency substrate 815 is formed on the lower ground 816. Four high-frequency transmission lines 814-1 connected to the driver IC 806 and four high-frequency transmission lines 814-2 connected to the TIA IC 808 are formed on the high-frequency substrate 815 to constitute microstrip lines.

Further, the housing 813 is equipped with a sapphire window 803-1 for outputting light, a sapphire window 803-2 for inputting light, and eight GPPO connectors 811-1 and 811-2. An output optical fiber 802-1 is connected to the sapphire window 803-1 for outputting light and an output optical connector 801-1 is connected to the output optical fiber 802-1. An input optical fiber 802-2 is connected to the sapphire window 803-2 for inputting light and an input optical connector 801-2 is connected to the input optical fiber 802-2. A lens 804-1 is disposed between the sapphire window 803-1 for outputting light and the optical modulator 805. A lens 804-2 is disposed between the sapphire window 803-2 for inputting light and the optical receiver 807. The GPPO connectors 811-1 are connected to the respective high-frequency transmission lines 814-1 and the GPPO connectors 811-2 are connected to the respective high-frequency transmission lines 814-2.

The optical module 800 also comprises DC pins 809-1 connected to the optical receiver 807 and DC pins 809-2 electrically connected to the TIA IC 808. The optical module 800 further comprises DC blocking capacitors 810-1 provided in the high-frequency transmission lines 814-1 and DC blocking capacitors 810-2 provided in the high-frequency transmission lines 814-2.

The optical module 800 is further equipped with a cover block 817 so as to cover the high-frequency transmission lines 814-1 and 814-2, the driver IC 806, the TIA IC 808, connection wires between the driver IC 806 and the optical modulator 805, and connection wires between the TIA IC 808 and the optical receiver 807. The cover block 817 is fixed to the high-frequency substrate 815 via spacers 818. The spacers 818 keep a given space between the cover block 817 and the high-frequency substrate 815 and the high-frequency transmission lines 814-1 and 814-2 on the high-frequency substrate 815. The size of the cover block 817 may be modified to cover only the high-frequency transmission lines 814-1 and 814-2. In the present embodiment, the material for the cover block 817 is copper. The material for the housing 813 is copper-tungsten, but may be a general metal.

In the optical module 800, a ground electrode 820 is formed between the driver IC 806 at a transmitting end and the TIA IC 808 at a receiving end and between the high-frequency transmission lines 814-1 at the transmitting end and the high-frequency transmission lines 814-2 at the receiving end which are formed on the high-frequency substrate 815.

The cover block 817 and the ground electrode 820 are grounded. The connection of the cover block 817 to the ground is made by forming the spacers 818 and the housing 813 as conductive components, providing metal vias in the lower substrate 812, and electrically connecting the cover block 817 to the lower ground 816. The connection of the ground electrode 820 to the ground is made by providing metal vias in the high-frequency substrate 815 and electrically connecting the ground electrode 820 to the lower ground 816.

Further, as shown in FIG. 8C, the sixth embodiment may be modified such that the cover block 817 is fixed to the high-frequency substrate 815 via the ground electrode 820 having a predetermined thickness instead of the spacers 818. In this case, the connection to the ground is made by providing metal vias in the high-frequency substrate 815 and electrically connecting the ground electrode 820 to the lower ground 816.

The optical module 800 has a parallel configuration of the optical signal transmission module and the optical signal reception module. That is, the optical connector 801-1, the optical fiber 802-1, the sapphire window 803-1, the lens 804-1, the optical modulator 805, the driver IC 806, the high-frequency transmission lines 814-1, the DC blocking capacitors 810-1, and the GPPO connectors 811-1 constitute the optical signal transmission module. Further, the optical connector 801-2, the optical fiber 802-2, the sapphire window 803-2, the lens 804-2, the optical receiver 807, the TIA IC 808, the high-frequency transmission lines 814-2, the DC blocking capacitors 810-2, and the GPPO connectors 811-2 constitute the optical signal reception module.

In an optical module having a parallel configuration like the present embodiment, crosstalk from the transmitting end (814-1) to the receiving end (814-2) and from the receiving end (814-2) to the transmitting end (814-1) in the high-frequency transmission lines can be reduced by providing the cover block 817 and the ground electrode 820. In particular, the present embodiment is effective in a case where there is a difference in signal level between signals passing through the transmitting end (814-1) and signals passing through the receiving end (814-2). At the same time, it is also possible to suppress crosstalk that occurs between wires in the connection wires between the driver IC 806 and the optical modulator 805 and crosstalk generated between the connection wires between the TIA IC 808 and the optical receiver 807.

Seventh Embodiment

Figure 9A:
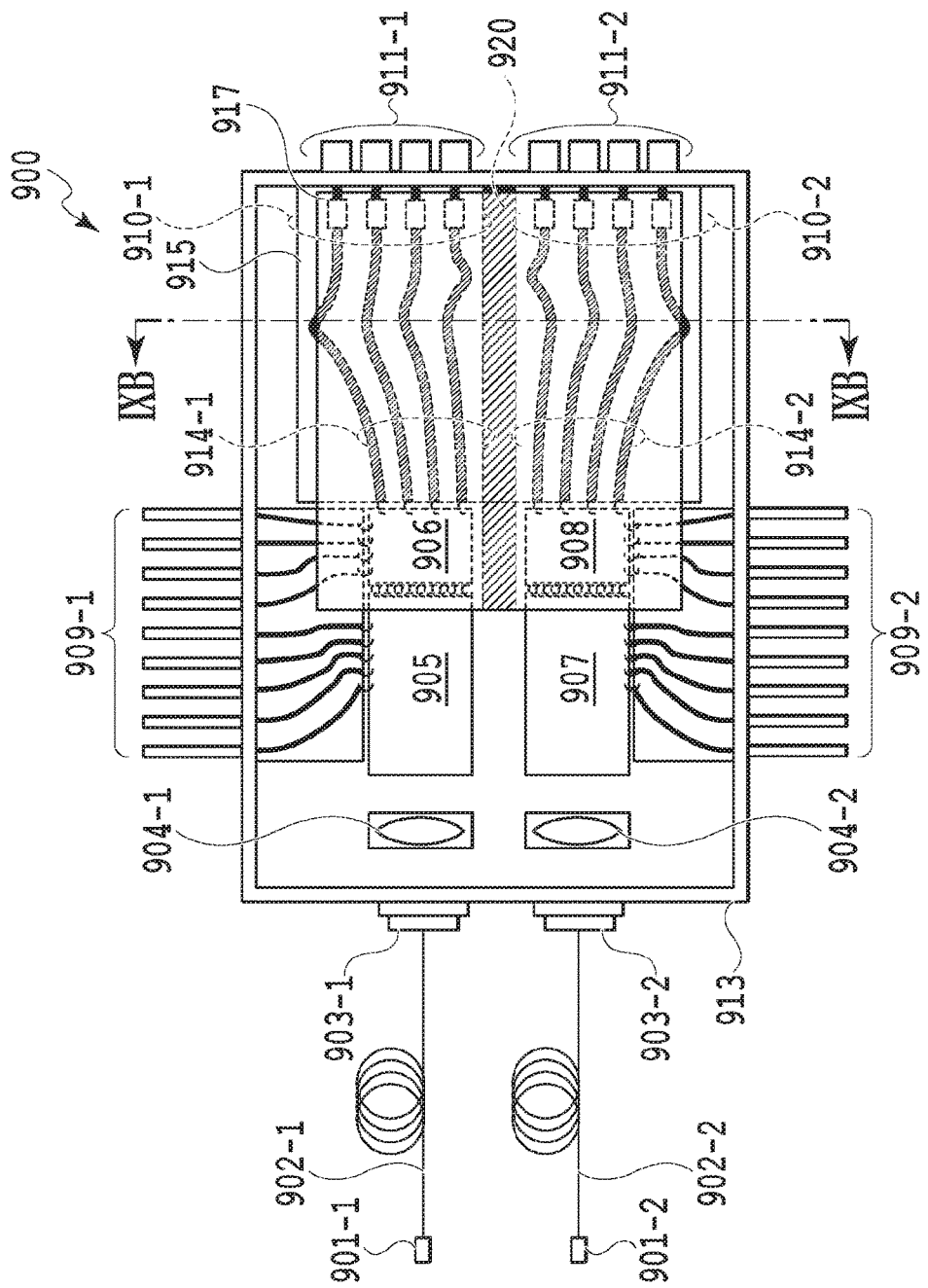
FIG. 9A is a top perspective view showing an optical module according to a seventh embodiment of the present invention.
Figure 9B:
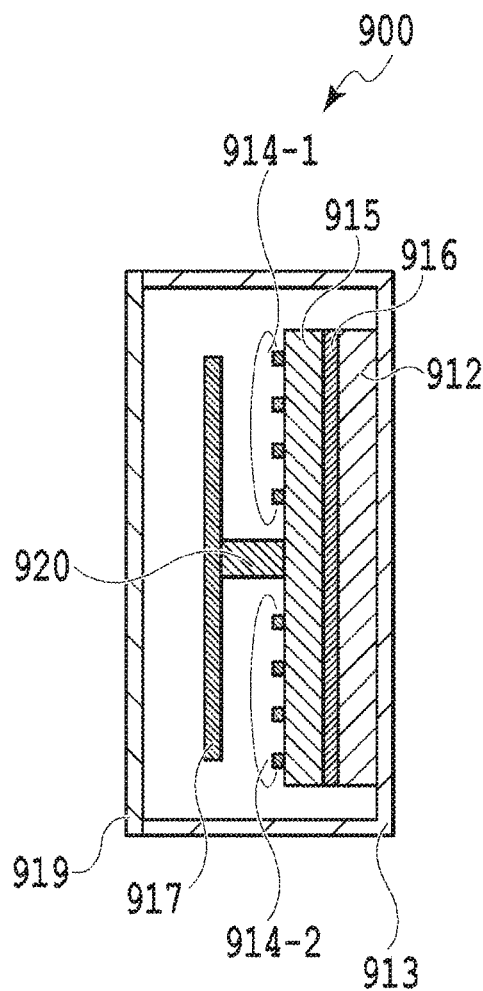
FIG. 9B is a cross-sectional view along line IXB-IXB in FIG. 9A.

FIG. 9A and FIG. 9B show the configuration of an optical module 900 according to a seventh embodiment of the present invention. FIG. 9A is a top perspective view of the optical module 900 and FIG. 9B is a cross-sectional view along line IXB-IXB in FIG. 9A. The optical module 900 shown in FIG. 9A and FIG. 9B is disposed at the bottom of a housing 913 and covered with a lid 919. Here, FIG. 9A shows the optical module 900 from which the lid 919 is detached and FIG. 9B shows the optical module 900 to which the lid 919 is attached. The optical module 900 includes an optical modulator 905, a driver IC 906 connected to the optical modulator 905, an optical receiver 907, and a transimpedance amplifier (TIA) IC 908 connected to the optical receiver 907, which are disposed at the bottom of the housing 913. The optical modulator 905 and the optical receiver 907 have the functions of an optical processing circuit and an electro-optical signal transducer. The optical modulator 905 and the driver IC 906 are connected to each other by wire bonding. The optical receiver 907 and the TIA IC 908 are also connected to each other by wire bonding.

Further, in the optical module 900, a lower substrate 912 is disposed at the bottom of the housing 913. A lower ground 916 is formed on the lower substrate 912 and a high-frequency substrate 915 is formed on the lower ground 916. Four high-frequency transmission lines 914-1 connected to the driver IC 906 and four high-frequency transmission lines 914-2 connected to the TIA IC 908 are formed on the high-frequency substrate 915 to constitute microstrip lines.

Further, the housing 913 is equipped with a sapphire window 903-1 for outputting light, a sapphire window 903-2 for inputting light, and eight GPPO connectors 911-1 and 911-2. An output optical fiber 902-1 is connected to the sapphire window 903-1 for outputting light and an output optical connector 901-1 is connected to the output optical fiber 902-1. An input optical fiber 902-2 is connected to the sapphire window 903-2 for inputting light and an input optical connector 901-2 is connected to the input optical fiber 902-2. A lens 904-1 is disposed between the sapphire window 903-1 for outputting light and the optical modulator 905. A lens 904-2 is disposed between the sapphire window 903-2 for inputting light and the optical receiver 907. The GPPO connectors 911-1 are connected to the respective high-frequency transmission lines 914-1 and the GPPO connectors 911-2 are connected to the respective high-frequency transmission lines 914-2.

The optical module 900 also comprises DC pins 909-1 connected to the optical receiver 907 and DC pins 909-2 electrically connected to the TIA IC 908. The optical module 900 further comprises DC blocking capacitors 910-1 provided in the high-frequency transmission lines 914-1 and DC blocking capacitors 910-2 provided in the high-frequency transmission lines 914-2.

The optical module 900 is further equipped with a cover block 917 so as to cover the high-frequency transmission lines 914-1 and 914-2, the driver IC 906, the TIA IC 908, connection wires between the driver IC 906 and the optical modulator 905, and connection wires between the TIA IC 908 and the optical receiver 907. In the optical module 900, a ground electrode 920 is formed in a longitudinal direction of the housing between the driver IC 906 at a transmitting end and the TIA IC 908 at a receiving end and between the high-frequency transmission lines 914-1 at the transmitting end and the high-frequency transmission lines 914-2 at the receiving end which are formed on the high-frequency substrate 915. The cover block 917 is fixed to the high-frequency substrate 915 via the ground electrode 920 having a predetermined thickness. The ground electrode 920 keep a given space between the cover block 917 and the high-frequency substrate 915 and the high-frequency transmission lines 914-1 and 914-2 on the high-frequency substrate 915. In the present embodiment, the material for the cover block 917 is copper. The material for the housing 913 is copper-tungsten, but may be a general metal.

Here, the cover block 917 and the ground electrode 920 are grounded. The connection to the ground is made by providing metal vias in the high-frequency substrate 915 and electrically connecting the ground electrode 920 to the lower ground 916.

However, the cover block 917 does not necessarily need to cover all the high-frequency transmission lines 914-1 and 914-2. The high-frequency transmission lines 914-1 and 914-2 may be partly out of the area covered by the cover block 917 as long as the cover block 917 can reduce crosstalk from the transmitting end (914-1) to the receiving end (914-2) and from the receiving end (914-2) to the transmitting end (914-1) in the high-frequency transmission lines.

Even in the present embodiment, crosstalk from the transmitting end (914-1) to the receiving end (914-2) and from the receiving end (914-2) to the transmitting end (914-1) in the high-frequency transmission lines can be reduced by providing the cover block 917 and the ground electrode 920. In particular, the present embodiment is effective in a case where there is a difference in signal level between signals passing through the transmitting end (914-1) and signals passing through the receiving end (914-2).

Eighth Embodiment

Figure 10A:
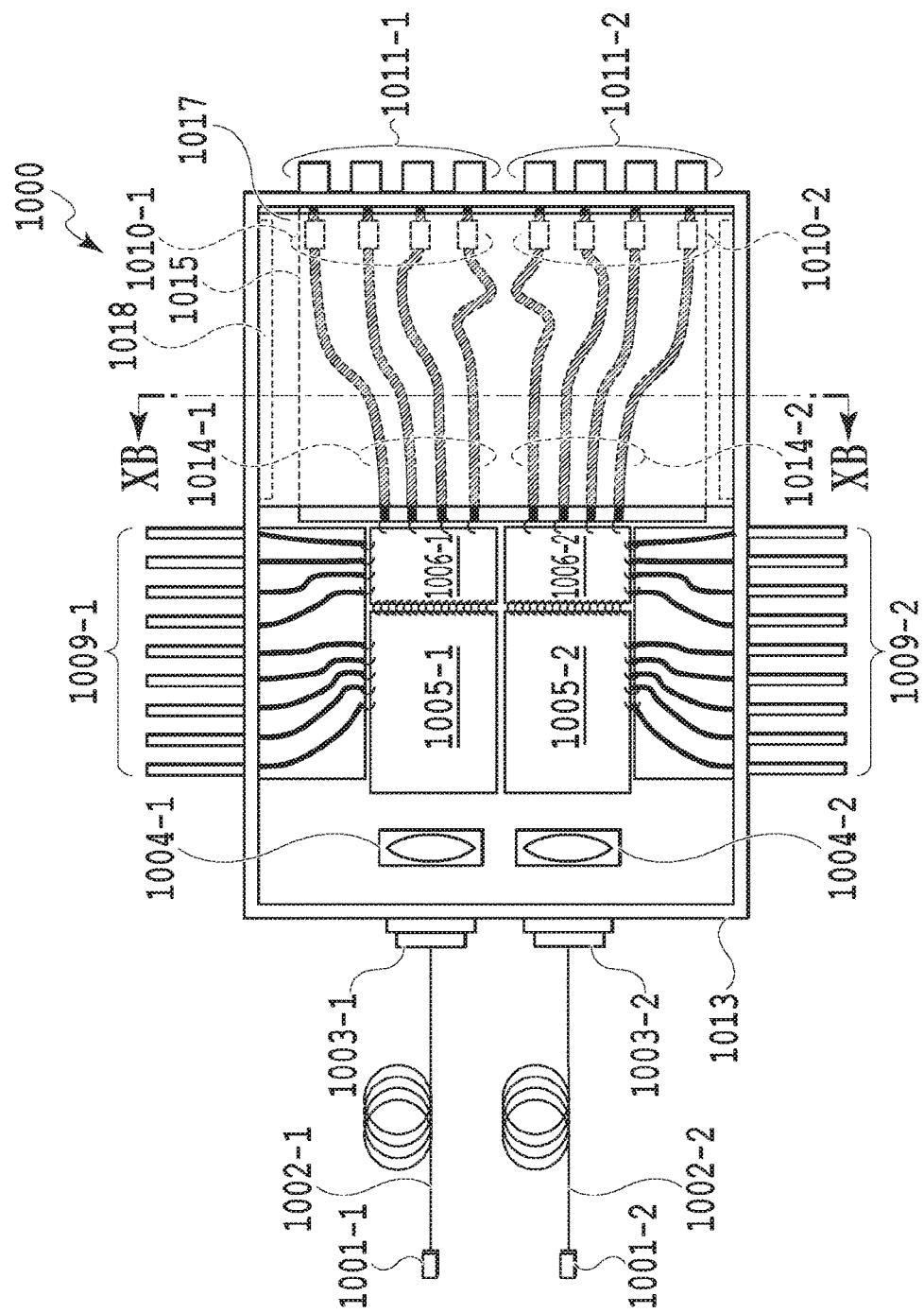
FIG. 10A is a top perspective view showing an optical module according to an eighth embodiment of the present invention.
Figure 10B:
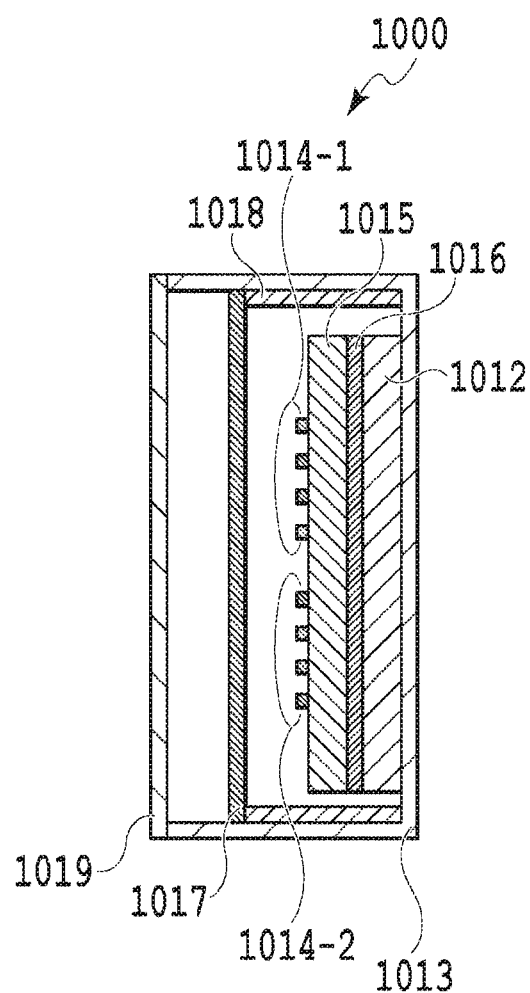
FIG. 10B is a cross-sectional view along line XB-XB in FIG. 10A.

FIG. 10A and FIG. 10B show the configuration of an optical module 1000 according to an eighth embodiment of the present invention. FIG. 10A is a top perspective view of the optical module 1000 and FIG. 10B is a cross-sectional view along line XB-XB in FIG. 10A. The optical module 1000 shown in FIG. 10A and FIG. 10B is disposed at the bottom of a housing 1013 and covered with a lid 1019. Here, FIG. 10A shows the optical module 1000 from which the lid 1019 is detached and FIG. 10B shows the optical module 1000 to which the lid 1019 is attached. The optical module 1000 has the parallel configuration of two optical signal transmission modules. That is, an optical connector 1001-1, an optical fiber 1002-1, a sapphire window 1003-1, a lens 1004-1, an optical modulator 1005-1, a driver IC 1006-1, high-frequency transmission lines 1014-1, DC blocking capacitors 1010-1, and GPPO connectors 1011-1 constitute a first optical signal transmission module. Further, an optical connector 1001-2, an optical fiber 1002-2, a sapphire window 1003-2, a lens 1004-2, an optical modulator 1005-2, a driver IC 1006-2, high-frequency transmission lines 1014-2, DC blocking capacitors 1010-2, and GPPO connectors 1011-2 constitute a second optical signal transmission module.

Even in the optical module 1000 of the present embodiment, crosstalk between the high-frequency transmission lines (1014-1 and 1014-2) constituting microstrip lines can be reduced by providing a grounded cover block 1017. The cover block 1017 can be connected to the ground in the same way as the fourth embodiment.

Ninth Embodiment

Figure 11A:
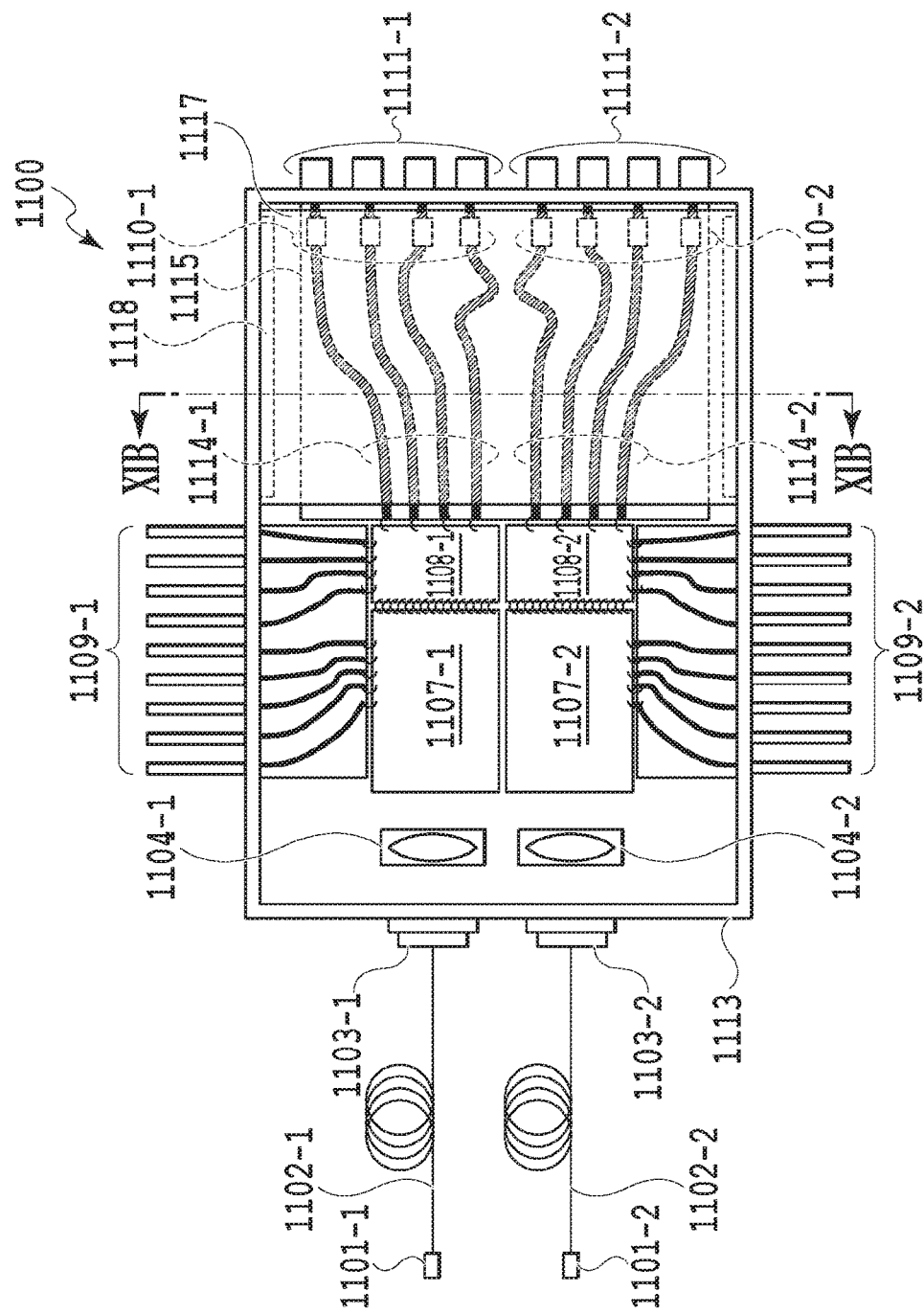
FIG. 11A is a top perspective view showing an optical module according to a ninth embodiment of the present invention.
Figure 11B:
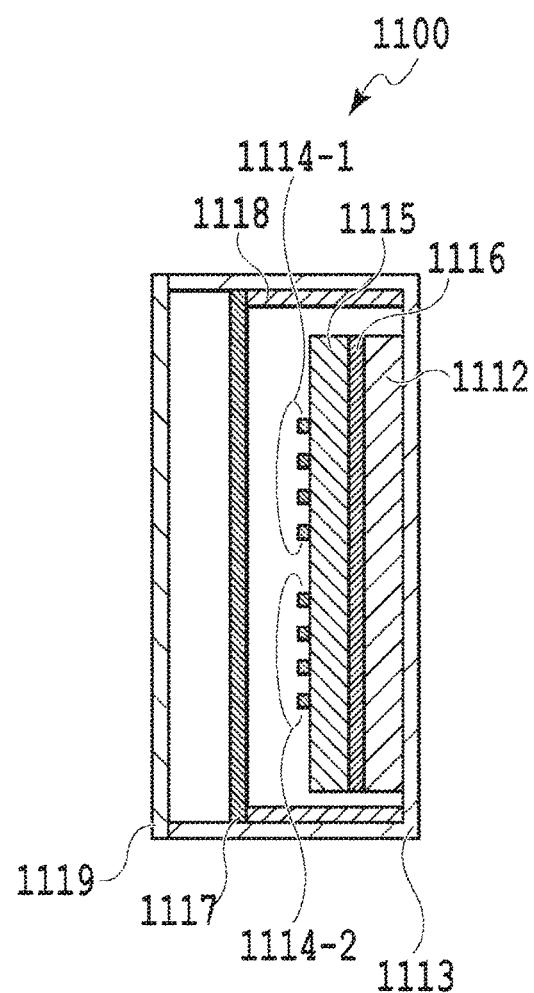
FIG. 11B is a cross-sectional view along line XIB-XIB in FIG. 11A.

FIG. 11A and FIG. 11B show the configuration of an optical module 1100 according to a ninth embodiment of the present invention. FIG. 11A is a top perspective view of the optical module 1100 and FIG. 11B is a cross-sectional view along line XIB-XIB in FIG. 11A. The optical module 1100 shown in FIG. 11A and FIG. 11B is disposed at the bottom of a housing 1113 and covered with a lid 1119. Here, FIG. 11A shows the optical module 1100 from which the lid 1119 is detached and FIG. 11B shows the optical module 1100 to which the lid 1119 is attached. The optical module 1100 of the present embodiment has a parallel configuration of two optical signal reception modules. That is, an optical connector 1101-1, an optical fiber 1102-1, a sapphire window 1103-1, a lens 1104-1, an optical receiver 1107-1, a driver IC 1106-1, high-frequency transmission lines 1114-1, DC blocking capacitors 1110-1, and GPPO connectors 1111-1 constitute a first optical signal reception module. Further, an optical connector 1101-2, an optical fiber 1102-2, a sapphire window 1103-2, a lens 1104-2, an optical receiver 1107-2, a driver IC 1106-2, high-frequency transmission lines 1114-2, DC blocking capacitors 1110-2, and GPPO connectors 1111-2 constitute a second optical signal reception module.

Even in the optical module 1100 of the present embodiment, crosstalk between the high-frequency transmission lines (1114-1 and 1114-2) constituting microstrip lines can be reduced by providing a grounded cover block 1117. The cover block 1117 can be connected to the ground in the same way as the first to eighth embodiments.

Tenth Embodiment

Figure 12A:
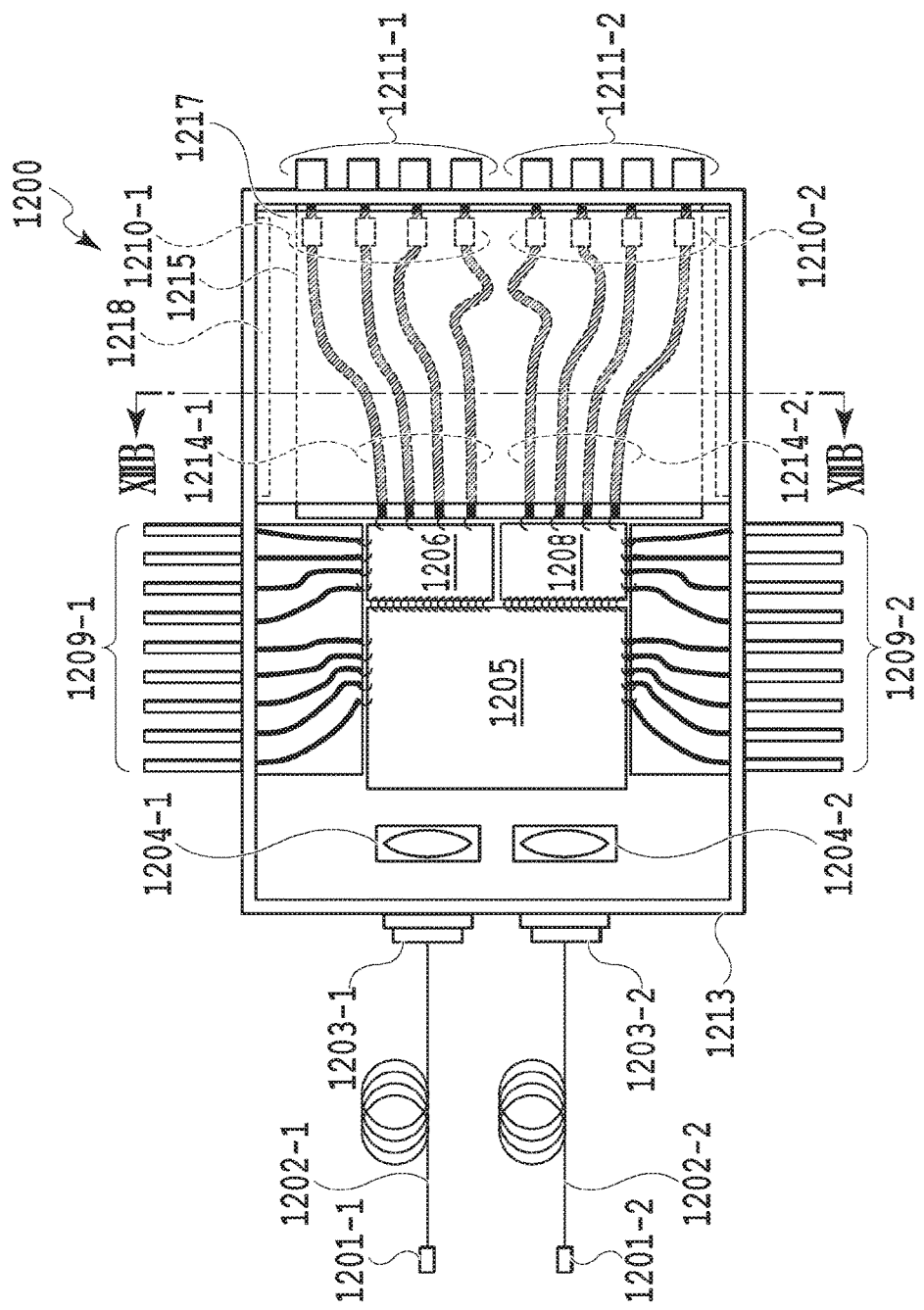
FIG. 12A is a top perspective view showing an optical module according to a tenth embodiment of the present invention.
Figure 12B:
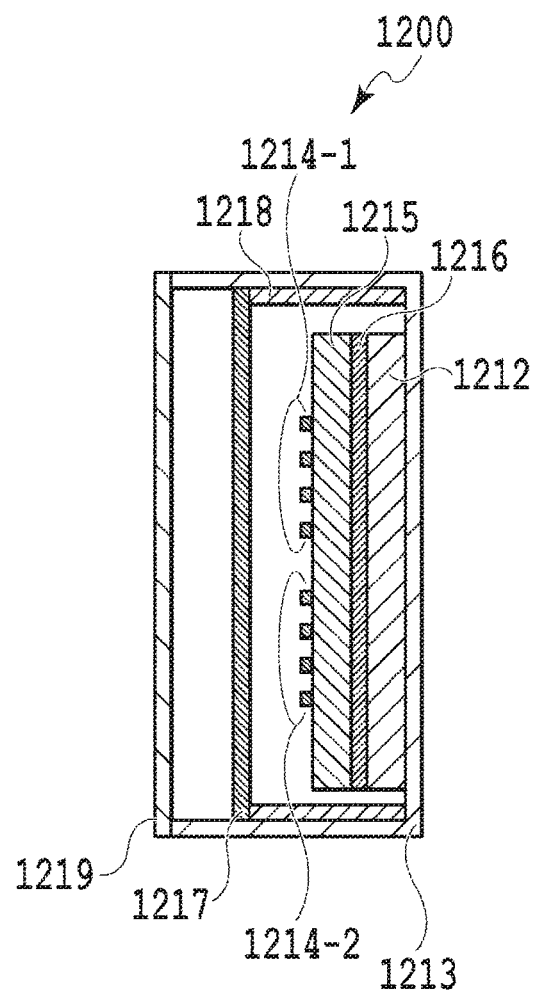
FIG. 12B is a cross-sectional view along line XIIB-XIIB in FIG. 12A.

FIG. 12A and FIG. 12B show the configuration of an optical module 1200 according to a tenth embodiment of the present invention. FIG. 12A is a top perspective view of the optical module 1200 and FIG. 12B is a cross-sectional view along line XIIB-XIIB in FIG. 12A. The optical module 1200 shown in FIG. 12A and FIG. 12B is disposed at the bottom of a housing 1213 and covered with a lid 1219. Here, FIG. 12A shows the optical module 1200 from which the lid 1219 is detached and FIG. 12B shows the optical module 1200 to which the lid 1219 is attached. The optical module 1200 of the present embodiment is characterized by comprising an optical transmission and reception chip 1205 obtained by integrating the optical modulator 505 and optical receiver 507 of the optical module 500 according to the fourth embodiment shown in FIG. 5A and FIG. 5B into one chip. That is, an optical connector 1201-1, an optical fiber 1202-1, a sapphire window 1203-1, a lens 1204-1, the optical transmission and reception chip 1205, a driver IC 1206, high-frequency transmission lines 1214-1, DC blocking capacitors 1210-1, and GPPO connectors 1211-1 constitute an optical signal transmission module. Further, an optical connector 1201-2, an optical fiber 1202-2, a sapphire window 1203-2, a lens 1204-2, the optical transmission and reception chip 1205, a driver IC 1208, high-frequency transmission lines 1214-2, DC blocking capacitors 1210-2, and GPPO connectors 1211-2 constitute an optical signal reception module.

Even in the optical module 1200 of the present embodiment, crosstalk between high-frequency transmission lines (1214-1 and 1214-2) constituting microstrip lines can be reduced by providing a grounded cover block 1217. The cover block 1217 can be connected to the ground in the same way as the fourth embodiment.

The present embodiment realizes the advantageous result of the present invention with a configuration effective at cost reduction and downsizing.

Eleventh Embodiment

Figure 13A:
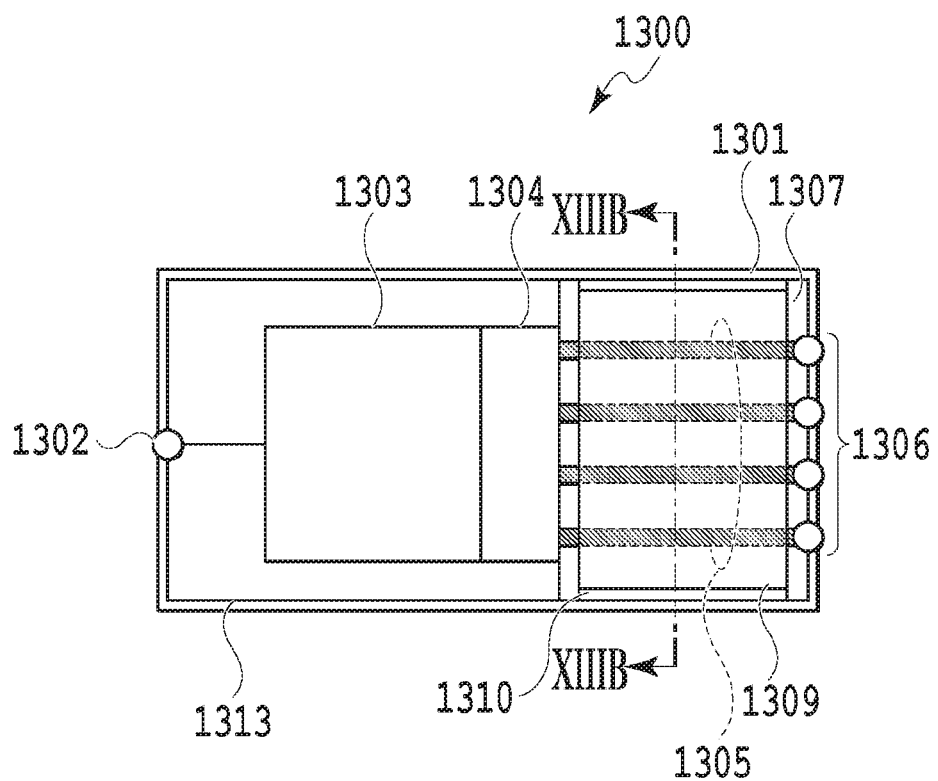
FIG. 13A is a top perspective view showing an optical module according to an eleventh embodiment of the present invention.
Figure 13B:
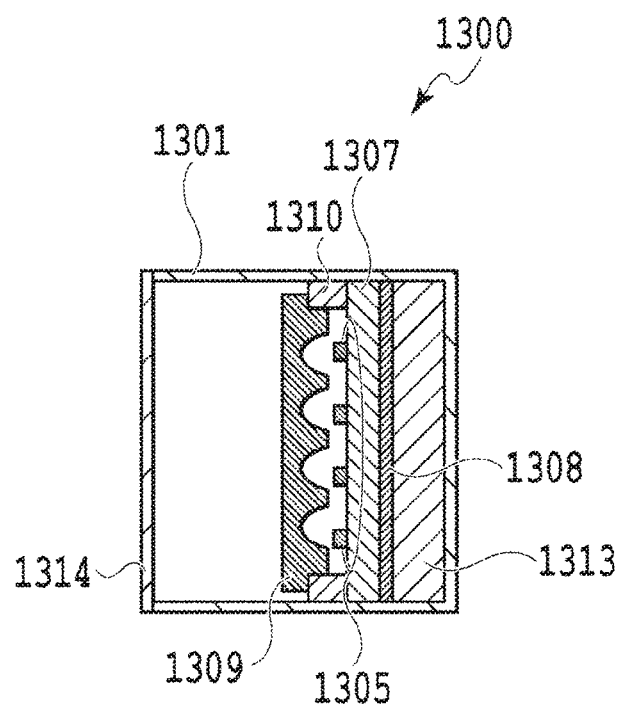
FIG. 13B is a cross-sectional view along line XIIIB-XIIIB in FIG. 13A.

FIG. 13A and FIG. 13B show the configuration of an optical module 1300 according to an eleventh embodiment of the present invention. FIG. 13A is a top perspective view of the optical module 1300 and FIG. 13B is a cross-sectional view along line XIIIB-XIIIB in FIG. 13A. The optical module 1300 shown in FIG. 13A and FIG. 13B is disposed at the bottom of a housing 1301 and covered with a lid 1314. Here, FIG. 13A shows the optical module 1300 from which the lid 1314 is detached and FIG. 13B shows the optical module 1300 to which the lid 1314 is attached. The optical module 1300 includes an optical processing circuit 1303, an electro-optical transducer 1304 connected to the optical processing circuit 1303, and a lower substrate 1313, which are disposed at the bottom of the housing 1301. A lower ground 1308 is formed on the lower substrate 1313 and a high-frequency substrate 1307 is formed on the lower ground 1308. Four high-frequency transmission lines 1305 connected to the electro-optical transducer 1304 are formed on the high-frequency substrate 1307 to constitute microstrip lines. The housing 1301 is equipped with an optical port 1302 and four electrical ports 1306. The optical port 1302 is connected to the optical processing circuit 1303 and the four electrical ports 1306 are connected to the high-frequency transmission lines 1305, respectively.

Further, in the optical module 1300, a cover block 1309 is provided above the high-frequency transmission lines 1305. The cover block 1309 is fixed to the high-frequency substrate 1307 via spacers 1310 and grounded. The connection to the ground is made by forming the spacers 1310 and the housing 1301 as conductive components and electrically connecting the cover block 1309 to the lower ground 1308.

The cover block 1309 is equipped with grooves formed to correspond to the high-frequency transmission lines 1305 such that the grooves of the cover block 1309 are located immediately above the high-frequency transmission lines 1305. Since the grooves are formed in the cover block 1309, the high-frequency transmission lines 1305 can be covered by the grooves from above, thereby further improving the crosstalk reduction effect of the cover block 1309 between the high-frequency transmission lines 1305.

Figure 14:
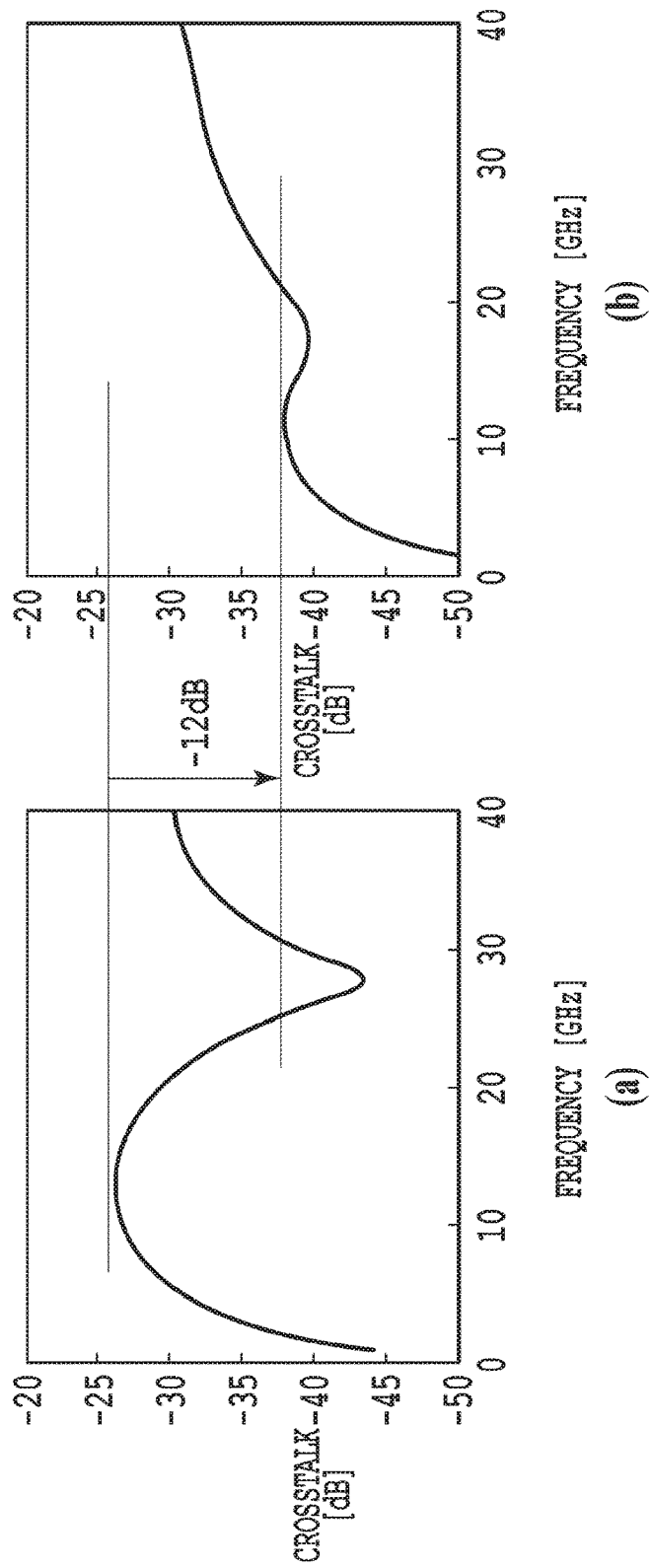
FIG. 14 is a graph showing the crosstalk suppression effect of the eleventh embodiment of the present invention, FIG. 14 (a) shows crosstalk characteristics in a conventional optical module and FIG. 14 (b) shows those in the present invention.

In the present embodiment, gold high-frequency transmission lines 1305 are formed on a ceramic high-frequency substrate 1307 having a thickness of 150 µm, and a copper cover block 1309 is disposed above the high-frequency transmission lines 1305. The high-frequency transmission lines 1305 are formed such that a pattern thickness is 2 µm, a width is 90 µm, a gap between transmission lines is 400 µm, and a distance between the cover block 1309 and the high-frequency substrate 1307 is 200 µm. FIG. 14 is a graph showing the crosstalk suppression effect of the present embodiment. FIG. 14 (*a*) shows crosstalk characteristics in a conventional optical module and FIG. 14 (*b*) shows those in the optical module 1400. FIGS. 14 (*a*) and (*b*) show that the optical module 1400 of the present embodiment produces a crosstalk suppression effect of 12 dB compared with the conventional one.

Twelfth Embodiment

Figure 15A:
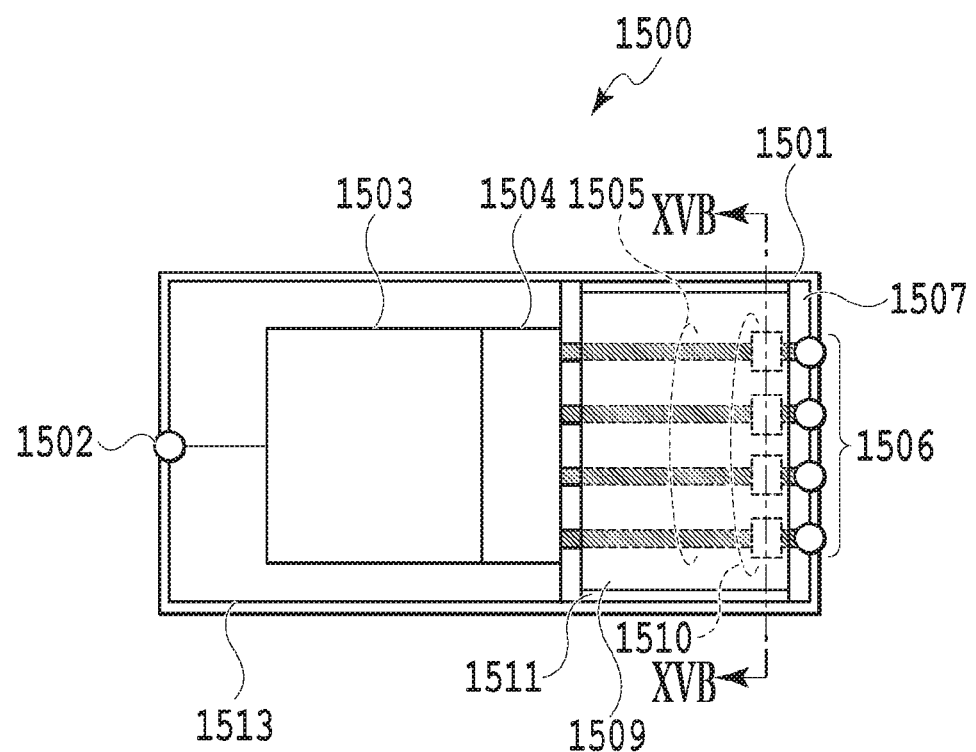
FIG. 15A is a top perspective view showing an optical module according to a twelfth embodiment of the present invention.
Figure 15B:
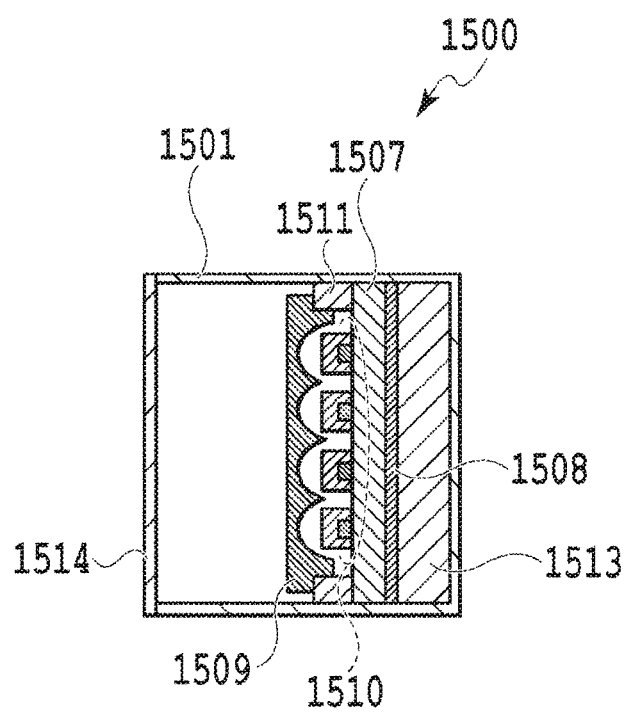
FIG. 15B is a cross-sectional view along line XVB-XVB in FIG. 15A.

FIG. 15A and FIG. 15B show the configuration of an optical module 1500 according to a twelfth embodiment of the present invention. FIG. 15A is a top perspective view of the optical module 1500 and FIG. 15B is a cross-sectional view along line XVB-XVB in FIG. 15A. The optical module 1500 shown in FIG. 15A and FIG. 15B is disposed at the bottom of a housing 1501 and covered with a lid 1514. Here, FIG. 15A shows the optical module 1500 from which the lid 1514 is detached and FIG. 15B shows the optical module 1500 to which the lid 1514 is attached. The optical module 1500 includes an optical processing circuit 1503, an electro-optical transducer 1504 connected to the optical processing circuit 1503, and a lower substrate 1513, which are at the bottom of the housing 1501. A lower ground 1508 is formed on the lower substrate 1513 and a high-frequency substrate 1507 is formed on the lower ground 1508. Four high-frequency transmission lines 1505 connected to the electro-optical transducer 1504 are formed on the high-frequency substrate 1507 to constitute microstrip lines. Each of the four high-frequency transmission lines 1505 is equipped with a DC blocking capacitor 1510 for cutting a direct-current component of a signal. The housing 1501 is equipped with an optical port 1502 and four electrical ports 1506. The optical port 1502 is connected to the optical processing circuit 1503 and the four electrical ports 1506 are connected to the high-frequency transmission lines 1505, respectively.

Further, in the optical module 1500, a cover block 1509 is provided above the high-frequency transmission lines 1505. The cover block 1509 is fixed to the high-frequency substrate 1507 via spacers 1511 and grounded. The connection to the ground is made by forming the spacers 1511 and the housing 1501 as conductive components and electrically connecting the cover block 1509 to the lower ground 1508.

The cover block 1509 is equipped with grooves formed to correspond to the high-frequency transmission lines 1505 such that the grooves of the cover block 1509 are located immediately above the high-frequency transmission lines 1505 and the blocking capacitors 1510. Since the grooves are formed in the cover block 1509, the high-frequency transmission lines 1505 and the blocking capacitors 1510 can be covered by the grooves from above. Even in the present embodiment, the crosstalk reduction effect between the high-frequency transmission lines 1505 can be further improved by the cover block 1509.

In the present embodiment, a case where a component mounted on a high-frequency transmission line is a DC blocking capacitor is described as an example. However, the present invention is not limited to this example. For instance, the component may be a chip resistor or a component having a complicated function such as an integrated circuit as a matter of course.

In the present embodiment, the DC blocking capacitors 1510 are mounted on the high-frequency lines by means of soldering. However, a mounting means used in the present invention is not limited to soldering. For instance, the components may be mounted using silver paste or bumps or by means of wire bonding as a matter of course.

Thirteenth Embodiment

Figure 16A:
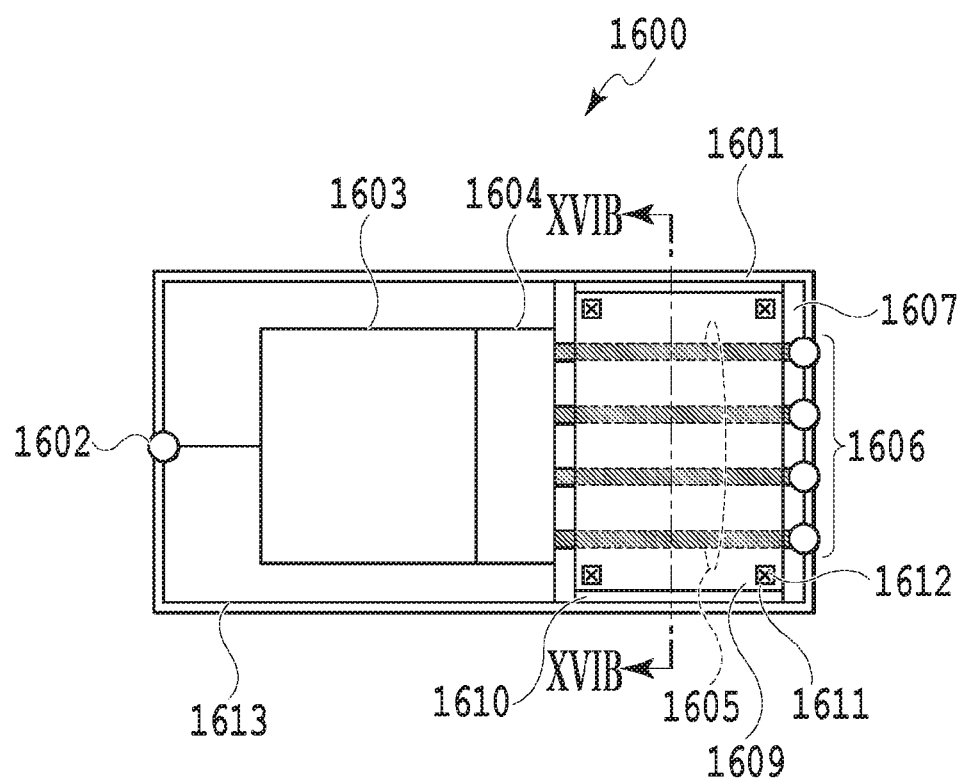
FIG. 16A is a top perspective view showing an optical module according to a thirteenth embodiment of the present invention.
Figure 16B:
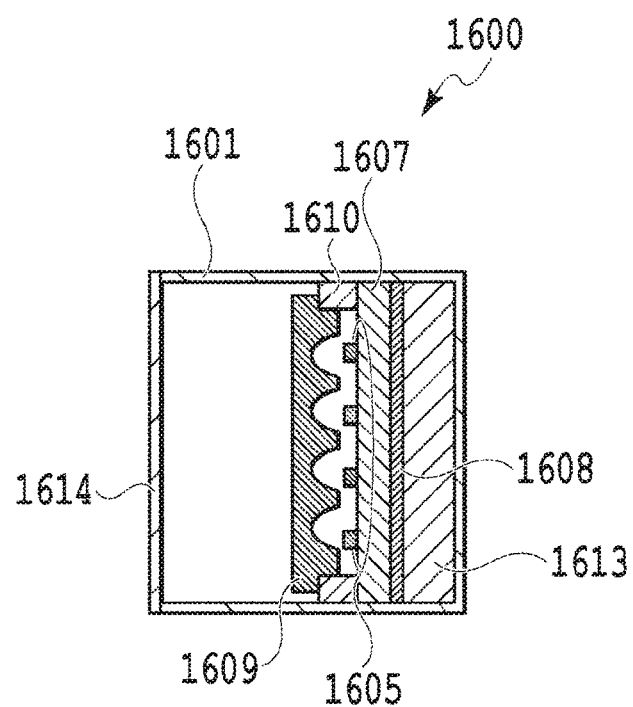
FIG. 16B is a cross-sectional view along line XVIB-XVIB in FIG. 16A.

FIG. 16A and FIG. 16B show the configuration of an optical module 1600 according to a thirteenth embodiment of the present invention. FIG. 16A is a top perspective view of the optical module 1600 from which a lid 1614 is detached and FIG. 16B is a cross-sectional view along line XVIB-XVIB in FIG. 16A. The optical module 1600 shown in FIG. 16A and FIG. 16B is disposed at the bottom of a housing 1601 and covered with the lid 1614. Here, FIG. 16A shows the optical module 1600 from which the lid 1614 is detached and FIG. 16B shows the optical module 1600 to which the lid 1614 is attached. The optical module 1600 includes an optical processing circuit 1603, an electro-optical transducer 1604 connected to the optical processing circuit 1603, and a lower substrate 1613, which are disposed on the substrate 1613 at the bottom of the housing 1601. A lower ground 1608 is formed on the lower substrate 1613 and a high-frequency substrate 1607 is formed on the lower ground 1608. Four high-frequency transmission lines 1605 connected to the electro-optical transducer 1604 are formed on the high-frequency substrate 1607 to constitute microstrip lines. The housing 1601 is equipped with an optical port 1602 and four electrical ports 1606. The optical port 1602 is connected to the optical processing circuit 1603 and the four electrical ports 1606 are connected to the high-frequency transmission lines 1605, respectively.

Further, the optical module 1600, a cover block 1609 is provided above the high-frequency transmission lines 1605. The cover block 1609 is fixed to the high-frequency substrate 1607 via spacers 1610 and grounded. The connection to the ground is made by forming the spacers 1610 and the housing 1601 as conductive components and electrically connecting the cover block 1609 to the lower ground 1608.

The cover block 1609 is equipped with grooves formed to correspond to the high-frequency transmission lines 1605 such that the grooves of the cover block 1609 are located immediately above the high-frequency transmission lines 1605.

In the optical module 1600, openings 1611 are provided on the cover block 1609 and markers 1612 are provided on the high-frequency substrate 1607. At the time of mounting the cover block 1609 on the high-frequency substrate 1607 in the present embodiment, the cover block 1609 is positioned such that the openings 1611 are aligned over the markers 1612. As a result, the grooves formed on the cover block 1609 can be properly aligned with the high-frequency transmission lines 1605 formed on the high-frequency substrate 1607. The proper alignment of the cover block 1609 enables crosstalk suppression without degrading the characteristics of the high-frequency transmission lines.

Fourteenth Embodiment

Figure 17A:
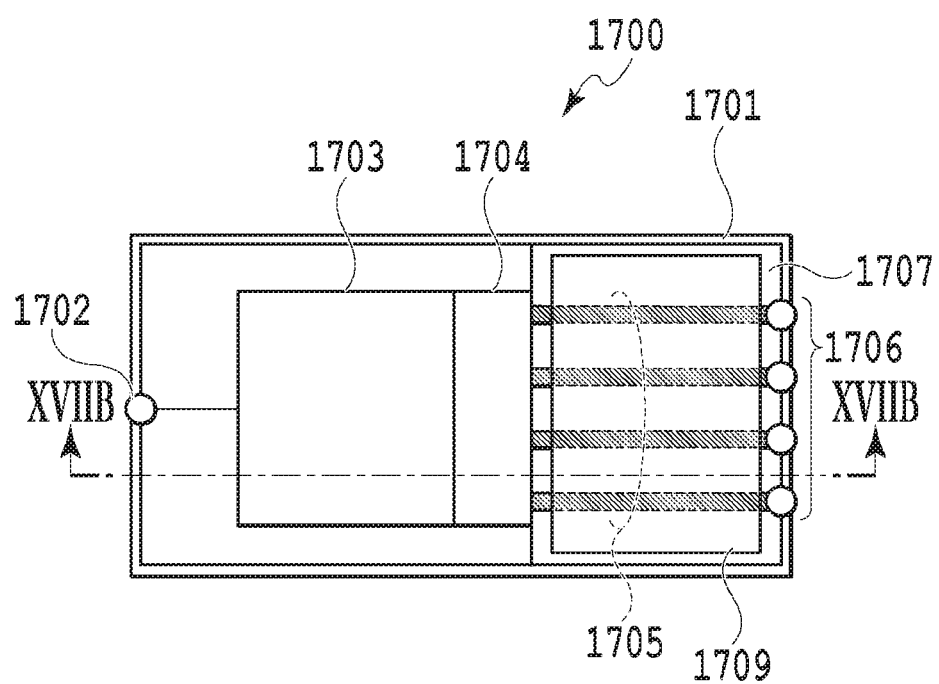
FIG. 17A is a top perspective view showing an optical module according to a fourteenth embodiment of the present invention.
Figure 17B:
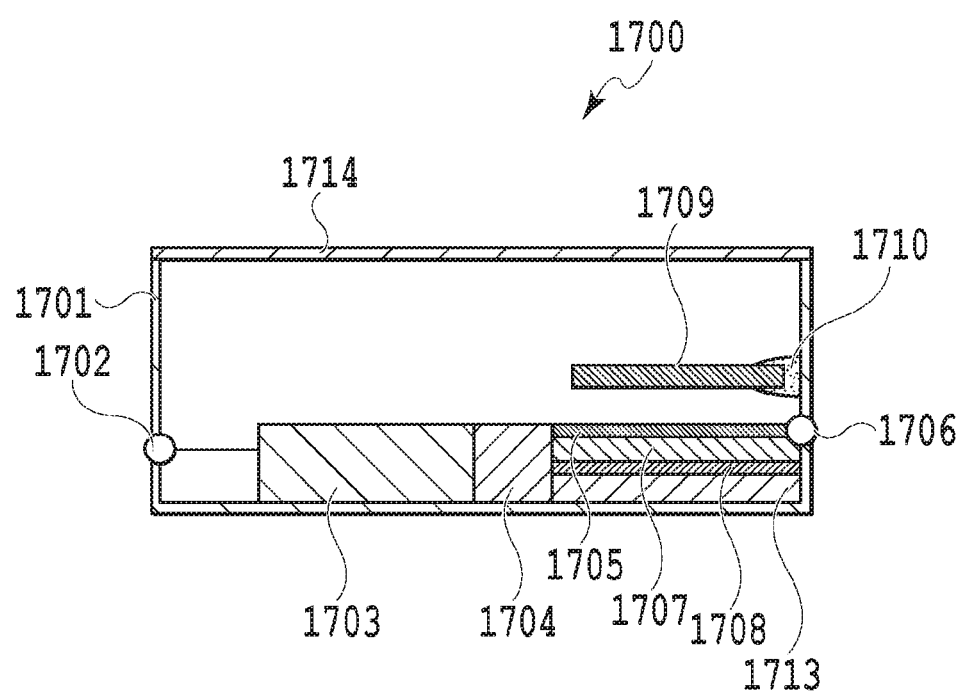
FIG. 17B is a cross-sectional view along line XVIIB-XVIIB in FIG. 17A.

FIG. 17A and FIG. 17B show the configuration of an optical module 1700 according to a fourteenth embodiment of the present invention. FIG. 17A is a top perspective view of the optical module 1700 and FIG. 17B is a cross-sectional view along line XVIIB-XVIIB in FIG. 17A. The optical module 1700 shown in FIG. 17A and FIG. 17B is disposed at the bottom of a housing 1701 and covered with a lid 1714. Here, FIG. 17A shows the optical module 1700 from which the lid 1714 is detached and FIG. 17B shows the optical module 1700 to which the lid 1714 is attached. The optical module 1700 includes an optical processing circuit 1703, an electro-optical transducer 1704 connected to the optical processing circuit 1703, and a lower substrate 1713, which are disposed at the bottom of the housing 1701. A lower ground 1708 is formed on the lower substrate 1713 and a high-frequency substrate 1707 is formed on the lower ground 1708. Four high-frequency transmission lines 1705 connected to the electro-optical transducer 1704 are formed on the high-frequency substrate 1707 to constitute microstrip lines. The housing 1701 is equipped with an optical port 1702 and four electrical ports 1706. The optical port 1702 is connected to the optical processing circuit 1703 and the four electrical ports 1706 are connected to the high-frequency transmission lines 1705, respectively.

Further, in the optical module 1700, a cover block 1709 is provided above the high-frequency transmission lines 1705. The cover block 1709 is fixed to the housing 1701 with solder 1710. The cover block 1709 is grounded. The connection to the ground is made by forming the housing 1701 as a conductive component and electrically connecting the cover block 1709 to the lower ground 1708.

In the optical module 1700 of the present embodiment, the cover block 1709 serving as a ground of the high-frequency transmission lines 1705 is electrically connected to the housing 1701 serving as a ground of the electrical ports 1706 with the solder 1710. As a result, it is possible to secure a path for return current flowing to the ground when high-frequency signals pass through the high-frequency transmission lines 1705, thereby suppressing crosstalk without degrading the characteristics of the high-frequency transmission lines.

Fifteenth Embodiment

Figure 18A:
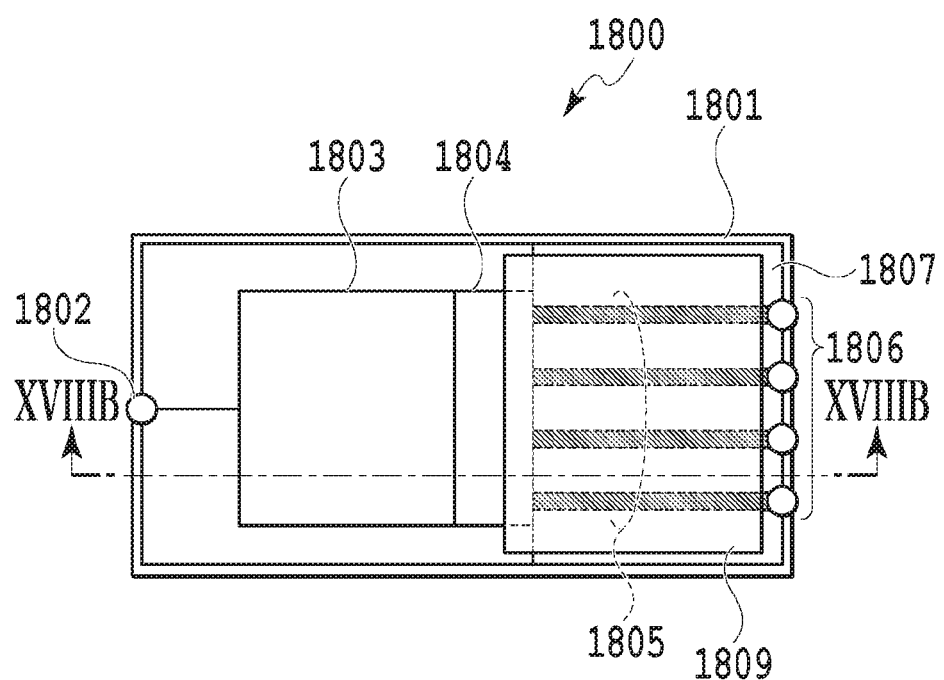
FIG. 18A is a top perspective view showing an optical module according to a fifteenth embodiment of the present invention.
Figure 18B:
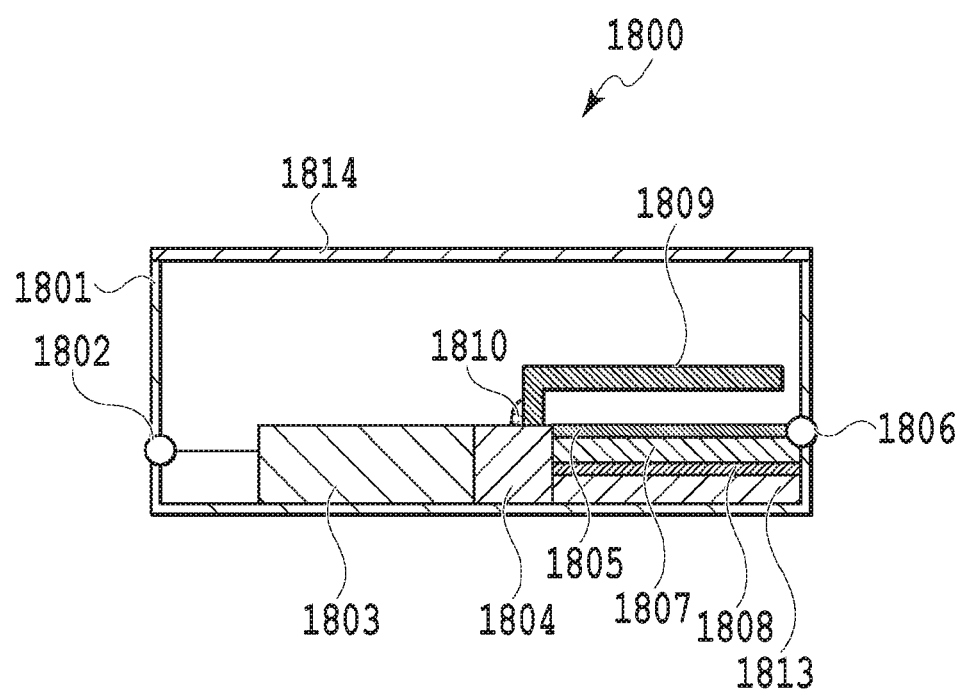
FIG. 18B is a cross-sectional view along line 18B-18B in FIG. 18A.

FIG. 18A and FIG. 18B show the configuration of an optical module 1800 according to a fifteenth embodiment of the present invention. FIG. 18A is a top perspective view of the optical module 1800 and FIG. 18B is a cross-sectional view along line XVIIIB-XVIIIB in FIG. 18A. The optical module 1800 shown in FIG. 18A and FIG. 18B is disposed at the bottom of a housing 1801 and covered with a lid 1814. Here, FIG. 18A shows the optical module 1800 from which the lid 1814 is detached and FIG. 18B shows the optical module 1800 to which the lid 1814 is attached. The optical module 1800 includes an optical processing circuit 1803, an electro-optical transducer 1804 connected to the optical processing circuit 1803, and a lower substrate 1813, which are disposed at the bottom of the housing 1801. A lower ground 1808 is formed on the lower substrate 1813 and a high-frequency substrate 1807 is formed on the lower ground 1808. Four high-frequency transmission lines 1805 connected to the electro-optical transducer 1804 are formed on the high-frequency substrate 1807 to constitute microstrip lines. The housing 1801 is equipped with an optical port 1802 and four electrical ports 1806. The optical port 1802 is connected to the optical processing circuit 1803 and the four electrical ports 1806 are connected to the high-frequency transmission lines 1805, respectively.

In the optical module 1800, a cover block 1809 is provided above the high-frequency transmission lines 1805. The cover block 1809 is fixed to the ground of the electro-optical transducer 1804 with solder 1810 and grounded. The ground of the electro-optical transducer 1804 is connected to the lower ground 1808 via a metal wire or the like.

The optical module 1800 of the present embodiment is characterized in that the cover block 1809 serving as a ground of the high-frequency transmission lines 1805 is electrically connected to the ground of the electro-optical transducer 1804 with the solder 1810. This configuration enables the cover block 1809 to be grounded even if the housing 1801 is not made of a conductive material. Further, it is possible to secure a path for return current flowing to the ground when high-frequency signals pass through the high-frequency transmission lines 1805, thereby suppressing crosstalk without degrading the characteristics of the high-frequency transmission lines.

Sixteenth Embodiment

Figure 19A:
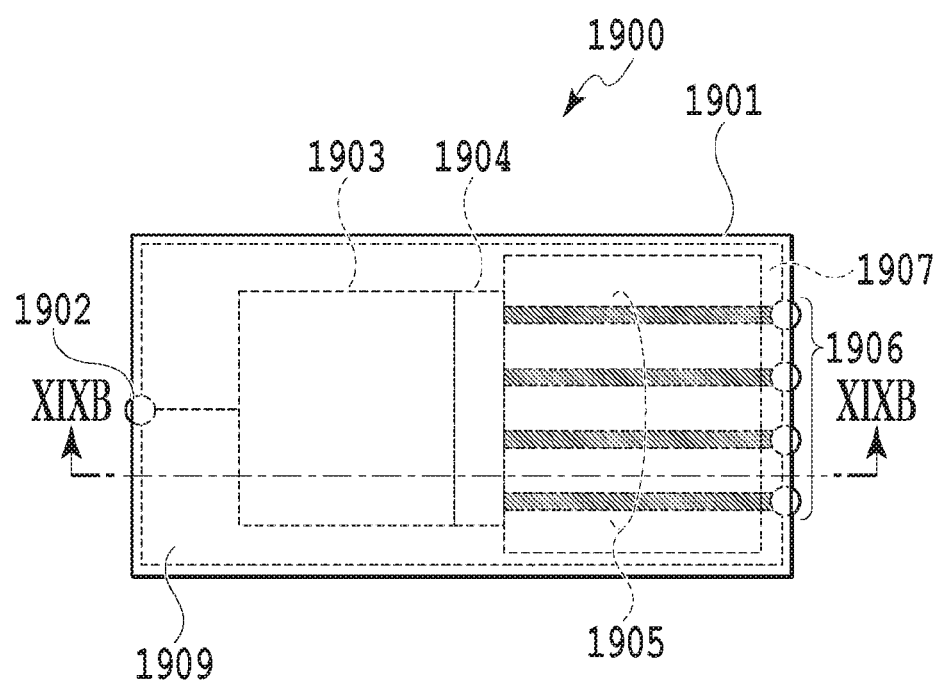
FIG. 19A is a top perspective view showing an optical module according to a sixteenth embodiment of the present invention.
Figure 19B:
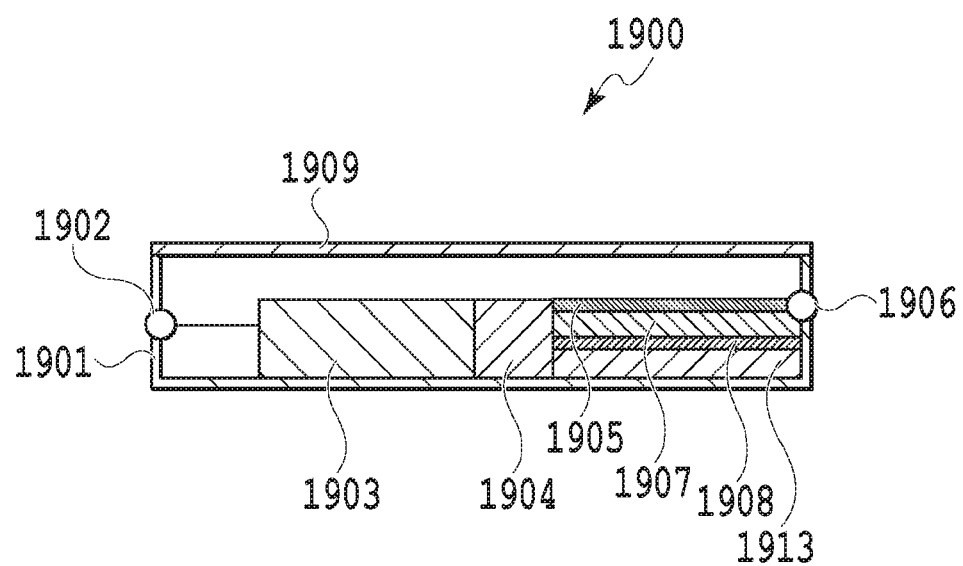
FIG. 19B is a cross-sectional view along line XIXB-XIXB in FIG. 19A.

FIG. 19A and FIG. 19B show the configuration of an optical module 1900 according to a sixteenth embodiment of the present invention. FIG. 19A is a top perspective view of the optical module 1900 and FIG. 19B is a cross-sectional view along line XIXB-XIXB in FIG. 19A. The optical module 1900 shown in FIG. 19A and FIG. 19B is disposed at the bottom of a housing 1901 and covered with a lid 1909. The optical module 1900 includes an optical processing circuit 1903, an electro-optical transducer 1904 connected to the optical processing circuit 1903, and a lower substrate 1913, which are disposed at the bottom of the housing 1901. A lower ground 1908 is formed on the lower substrate 1913 and a high-frequency substrate 1907 is formed on the lower ground 1908. Four high-frequency transmission lines 1905 connected to the electro-optical transducer 1904 are formed on the high-frequency substrate 1907 to constitute microstrip lines. The housing 1901 is equipped with an optical port 1902 and four electrical ports 1906. The optical port 1902 is connected to the optical processing circuit 1903 and the four electrical ports 1906 are connected to the high-frequency transmission lines 1905, respectively.

In the optical module 1900, the lid 1909 to be a cover block is provided above the high-frequency transmission lines 1905. The height of the housing 1901 is set such that a given space can be kept between the lid 1909 and the high-frequency substrate 1907 and the high-frequency transmission lines 1905 on the high-frequency substrate 1907. The lid 1909 is grounded. The connection to the ground is made by forming the housing 1901 as a conductive component and electrically connecting the cover block 1909 to the lower ground 1908.

Seventeenth Embodiment

In a seventeenth embodiment of the present invention, the material for the housing according to the first to fourteenth and sixteenth embodiments can be changed from a conductive material (e.g., copper-tungsten) to a nonconductive material such as ceramic or resin. In this case, the cover block and the ground electrode should be electrically connected to the lower ground.

The invention claimed is:

1. An optical module comprising:
a conductive housing;
a conductive cover block; and
at least one set, each set including:
an optical port;
an optical processing circuit optically connected to the optical port;
an electro-optical transducer optically connected to the optical processing circuit;
two or more high-frequency transmission lines connected to the electro-optical transducer;
electrical ports connected to the two or more high-frequency transmission lines, and
a lower ground formed between a first substrate, which contacts the two or more high-frequency transmission lines, and a second substrate; and
wherein:
the conductive cover block is provided above the high-frequency transmission lines;
the conductive housing covers the set and the conductive cover block; and
the conductive cover block and the conductive housing are electrically connected to the lower ground to be grounded.

2. The optical module according to claim 1, further comprising wherein an optical signal transmission module that includes a first set of the at least one set and an optical signal reception module including a second set of the at least one set are disposed in parallel.

3. The optical module according to claim 2, wherein the optical processing circuit and the electro-optical transducer included in the optical signal transmission module and the optical processing circuit and the electro-optical transducer included in the optical signal reception module are integrated into one chip.

4. The optical module according to claim 2, wherein a ground electrode is inserted between the high-frequency transmission lines included in the first set of the optical signal transmission module and the high-frequency transmission lines included in the second set of the optical signal reception module.

5. The optical module according to claim 1, further comprising optical signal transmission modules, each including one of the at least one set, are disposed in parallel.

6. The optical module according to claim 1, further comprising optical signal reception modules, each including one of the at least one set, are disposed in parallel.

7. The optical module according to claim 1 wherein an IC driver is inserted between the electro-optical transducer and the high-frequency transmission lines.

8. The optical module according to claim 7, wherein the conductive cover block covers up to a connecting portion between the IC driver and the electro-optical transducer.

9. The optical module according to claim 1, wherein a ground electrode is inserted between adjacent high-frequency transmission lines out of the two or more high-frequency transmission lines.

10. The optical module according to claim 9, wherein the conductive cover block is supported by the ground electrode with a desired interval between the conductive cover block and the high-frequency transmission lines.

11. The optical module according to claim 1, wherein grooves are formed in the conductive cover block and the grooves are disposed so as to cover the high-frequency transmission lines.

12. The optical module according to claim 1, wherein the conductive cover block comprises an opening for alignment, wherein
a marker for the alignment is provided around a spacer which supports the conductive cover block, and
the conductive cover block is positioned such that the marker is aligned with the opening for alignment.

13. The optical module according to claim 1, wherein the conductive cover block is electrically connected to a ground of the electrical ports.

* * * * *